United States Patent
Sagawa et al.

(10) Patent No.: US 10,061,214 B2
(45) Date of Patent: Aug. 28, 2018

(54) EXPOSURE APPARATUS, EXPOSURE METHOD, EXPOSURE APPARATUS MAINTENANCE METHOD, EXPOSURE APPARATUS ADJUSTMENT METHOD AND DEVICE MANUFACTURING METHOD

(75) Inventors: Natsuko Sagawa, Tokyo (JP); Katsushi Nakano, Tokyo (JP); Kenichi Shiraishi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 710 days.

(21) Appl. No.: 13/508,630

(22) PCT Filed: Nov. 9, 2010

(86) PCT No.: PCT/JP2010/070413
§ 371 (c)(1),
(2), (4) Date: Aug. 23, 2012

(87) PCT Pub. No.: WO2011/055860
PCT Pub. Date: May 12, 2011

(65) Prior Publication Data
US 2012/0314193 A1  Dec. 13, 2012

(30) Foreign Application Priority Data
Nov. 9, 2009  (JP) ................. 2009-256372

(51) Int. Cl.
*G03B 27/52* (2006.01)
*G03F 7/20* (2006.01)

(52) U.S. Cl.
CPC ...... *G03F 7/70975* (2013.01); *G03F 7/70541* (2013.01)

(58) Field of Classification Search
CPC .......... G03F 7/70541; G03F 7/70975
USPC .......... 355/30, 72, 77, 52
See application file for complete search history.

(56) References Cited

U.S. PATENT DOCUMENTS

| | | | |
|---|---|---|---|
| 4,465,368 A | 8/1984 | Matsuura et al. |
| 4,666,273 A | 5/1987 | Shimizu et al. |
| 5,493,403 A | 2/1996 | Nishi |
| 6,208,407 B1 | 3/2001 | Loopstra |
| 6,235,438 B1 | 5/2001 | Suzuki et al. |
| 6,262,796 B1 | 7/2001 | Loopstra et al. |
| 6,341,007 B1 | 1/2002 | Nishi et al. |
| 6,400,441 B1 | 6/2002 | Nishi et al. |

(Continued)

FOREIGN PATENT DOCUMENTS

| | | | |
|---|---|---|---|
| EP | 1 079 223 A1 | 2/2001 |
| EP | 1 713 113 A1 | 10/2006 |

(Continued)

OTHER PUBLICATIONS

Mar. 4, 2011 International Search Report issued in International Application No. PCT/JP2010/070413.

(Continued)

*Primary Examiner* — Deoram Persaud
(74) *Attorney, Agent, or Firm* — Oliff PLC

(57) ABSTRACT

An exposure apparatus exposes a substrate using exposure light via a liquid. The exposure apparatus comprises a substrate holding part, which releasably holds and is capable of moving a substrate, a management apparatus, which manages a status of usage of a dummy substrate that the substrate holding part is capable of holding.

35 Claims, 9 Drawing Sheets

(56) References Cited

U.S. PATENT DOCUMENTS

| | | |
|---|---|---|
| 6,452,292 B1 | 9/2002 | Binnard |
| 6,549,269 B1 | 4/2003 | Nishi et al. |
| 6,590,634 B1 | 7/2003 | Nishi et al. |
| 6,611,316 B2 | 8/2003 | Sewell |
| 6,721,039 B2 | 4/2004 | Ozawa |
| 6,778,257 B2 | 8/2004 | Bleeker et al. |
| 6,897,963 B1 | 5/2005 | Taniguchi et al. |
| 7,023,610 B2 | 4/2006 | Ohtsuki et al. |
| 7,961,295 B2 | 6/2011 | Yabu |
| 2002/0041377 A1 | 4/2002 | Hagiwara et al. |
| 2002/0061469 A1 | 5/2002 | Tanaka |
| 2005/0206850 A1 | 9/2005 | Shimizu et al. |
| 2005/0248856 A1 | 11/2005 | Omura et al. |
| 2005/0250277 A1* | 11/2005 | Chang ............... H01L 21/02079 438/202 |
| 2006/0023186 A1 | 2/2006 | Binnard |
| 2006/0068110 A1 | 3/2006 | Fukuda et al. |
| 2006/0132737 A1 | 6/2006 | Magome et al. |
| 2007/0127006 A1 | 6/2007 | Shibazaki |
| 2007/0132976 A1 | 6/2007 | Nagasaka |
| 2007/0177125 A1 | 8/2007 | Shibazaki |
| 2007/0253710 A1 | 11/2007 | Kaneyama et al. |
| 2007/0288121 A1 | 12/2007 | Shibazaki |
| 2008/0049209 A1 | 2/2008 | Nagasaka et al. |
| 2008/0156356 A1 | 7/2008 | Nagasaka et al. |
| 2009/0009746 A1* | 1/2009 | Auer-Jongepier .. G03F 7/70525 355/72 |
| 2009/0251672 A1 | 10/2009 | Nagasaka et al. |
| 2009/0257035 A1 | 10/2009 | Yabu |

FOREIGN PATENT DOCUMENTS

| | | | |
|---|---|---|---|
| EP | 1 768 170 A1 | | 3/2007 |
| JP | 10321486 A | * | 12/1998 |
| JP | A-2007-294817 | | 11/2007 |
| JP | A-2009-259870 | | 11/2009 |
| TW | 200903589 A | | 1/2009 |
| WO | WO 01/35168 A1 | | 5/2001 |
| WO | WO 2005/036620 A1 | | 4/2005 |

OTHER PUBLICATIONS

Mar. 4, 2011 Written Opinion of the International Searching Authority issued in International Application No. PCT/JP2010/070413.

Japanese Office Action issued in Japanese Patent Application No. 2012-537550 dated Aug. 5, 2014 (with translation).

Jul. 23, 2015 Office Action issued in Taiwanese Application No. 099138613.

Aug. 17, 2016 Office Action issued in Korean Patent Application No. 2012-7014633.

Feb. 26, 2016 Office Action issued in Taiwanese Application No. 099138613.

Jun. 23, 2017 Decision of Final Rejection issued in Korean Application No. 10-2012-7014633.

Dec. 8, 2017 Office Action issued in Taiwanese Patent Application No. 105128626.

\* cited by examiner

EXPOSURE APPARATUS, EXPOSURE METHOD, EXPOSURE APPARATUS MAINTENANCE METHOD, EXPOSURE APPARATUS ADJUSTMENT METHOD AND DEVICE MANUFACTURING METHOD

BACKGROUND

The present invention relates to an exposure apparatus, an exposure method, an exposure apparatus maintenance method, an exposure apparatus adjustment method and a device manufacturing method.

Priority is claimed on Japanese Patent Application No. 2009/256372, filed Nov. 9, 2009, the contents of which are incorporated herein by reference.

In exposure apparatuses used in lithography processes, liquid immersion exposure apparatuses that expose a substrate using exposure light via a liquid, such as that disclosed in the patent document (U.S. Patent Application Publication No. 2006/0132737 specification), are known. The exposure apparatus comprises a substrate holding part, which releasably holds a substrate, and exposes a substrate held by that substrate holding part.

SUMMARY

In the case in which prescribed processing is performed using a dummy substrate that the substrate holding part is able to hold, for example, when a deteriorated dummy substrate is continually used, there is a possibility that it will no longer be possible to favorably execute that prescribed processing. As a result, there is a possibility that exposure performance will drop, such as in exposure defects occurring, and that defective devices will occur.

A purpose of the modes of the present invention is to provide an exposure apparatus that is able to favorably execute processing that uses a dummy substrate and is able to restrict decreases in exposure performance as well as an exposure method, exposure apparatus maintenance method, and exposure apparatus adjustment method. In addition, a purpose of the modes of the present invention is to provide a device manufacturing method that is able to restrict the occurrence of defective devices.

Provided according to the first aspect of the present invention is an exposure apparatus that exposes a substrate using exposure light via a liquid; comprising a substrate holding part, which releasably holds and is capable of moving the substrate, a management apparatus, which manages the status of usage of a dummy substrate that the substrate holding part is capable of holding.

Provided according to the second aspect of the present invention is a device manufacturing method; including exposure of the substrate using an exposure apparatus according to the first aspect and development of the exposed substrate.

Provided according to the third aspect of the present invention is an exposure method that exposes a substrate using exposure light via a liquid; including exposure of the substrate held by the substrate holding part with the exposure light, holding of the dummy substrate by the substrate holding part and execution of the prescribed processing using the dummy substrate, management of the status of usage of the dummy substrate.

Provided according to the fourth aspect of the present invention is a device manufacturing method; including exposure of the substrate using an exposure method of the third aspect and development of the exposed substrate.

Provided according to the fifth aspect of the present invention is a maintenance method of an exposure apparatus that exposes a substrate using exposure light via a liquid; including holding of the dummy substrate at the substrate holding part, which releasably holds the substrate, holding of a liquid between the dummy substrate and a prescribed member to perform maintenance of the prescribed member, management of the status of usage of the dummy substrate.

Provided according to the sixth aspect of the present invention is a device manufacturing method; including exposure of a substrate using an exposure apparatus maintained by a maintenance method of the fifth aspect and development of the exposed substrate.

Provided according to the seventh aspect of the present invention is an adjustment method of an exposure apparatus that exposes a substrate using exposure light via a liquid; including holding of a dummy substrate by a substrate holding part, which releasably holds the substrate, adjustment of a prescribed position in a status in which the dummy substrate has been held by the substrate holding part, management of the status of usage of the dummy substrate.

Provided according to the eighth aspect of the present invention is a device manufacturing method; including exposing a substrate using an exposure apparatus adjusted by an adjustment method of the seventh aspect and developing the exposed substrate.

Provided according to the seventh aspect of the present invention is a dummy substrate which is releasably held by a substrate holding part of an exposure apparatus that exposes a substrate using exposure light via a liquid; wherein management parameters corresponding to the description of usage in the exposure apparatus.

According to the aspects of the present invention, it is possible to restrict decreases in exposure performance and to restrict the occurrence of defective devices.

Figure 1:
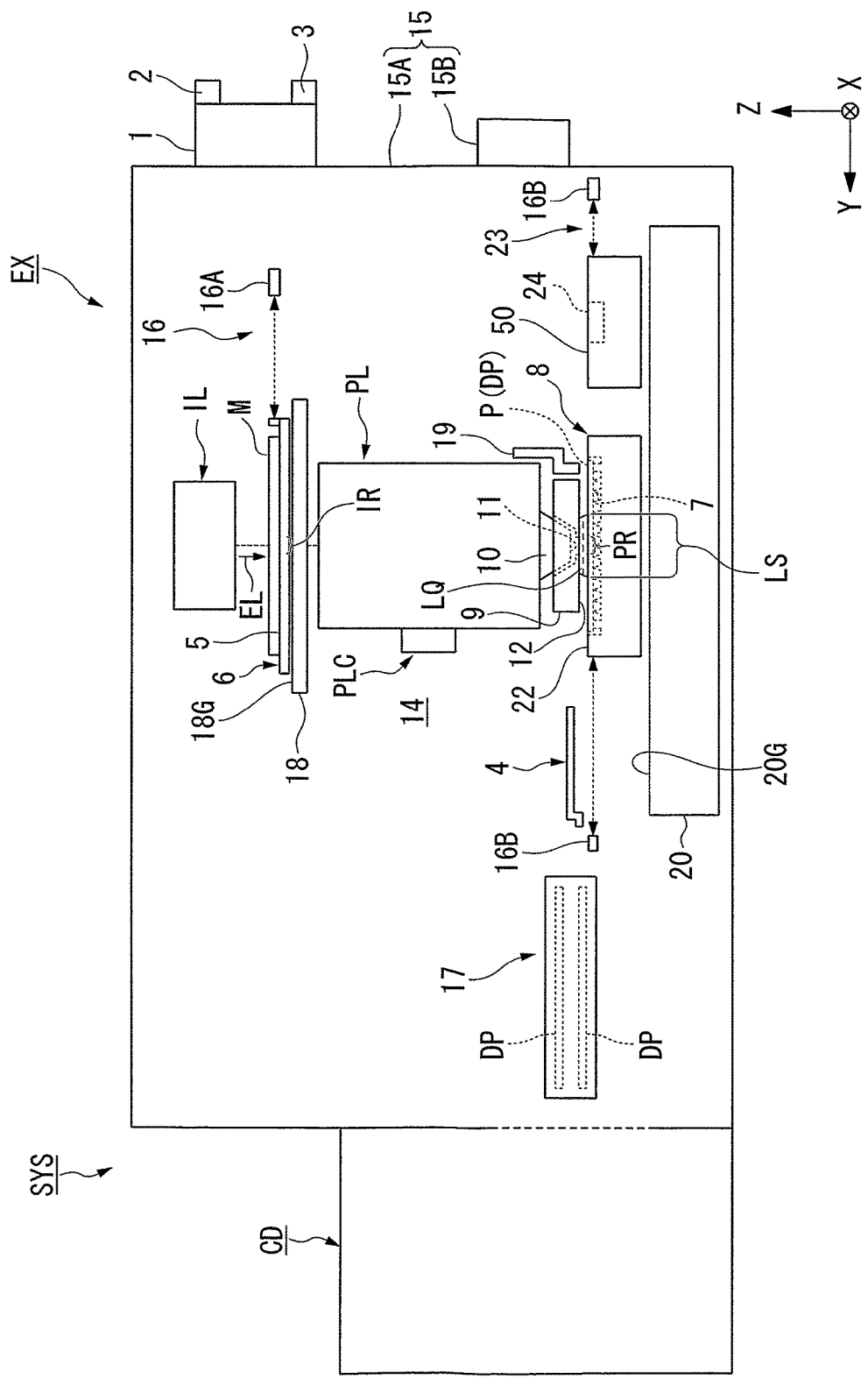
FIG. 1 is a schematic block diagram that shows an example of an exposure apparatus.

DESCRIPTION OF THE REFERENCE SYMBOLS 1 control apparatus
2 storage apparatus
3 management apparatus
5 mask holding part
6 mask stage
7 substrate holding part 8 substrate stage
9 liquid immersion member
10 terminal optical element
11 emitting surface
13 accommodating apparatus
14 internal space
15 chamber apparatus
15A chamber member
17 buffer part
DP dummy substrate
EL exposure light
EX exposure apparatus
LQ liquid
P substrate
PL projection optical system

DESCRIPTION OF EMBODIMENTS

An embodiment of the present invention will be described below while referring to drawings, but the present invention is not limited thereto. In the description below, an XYZ rectangular coordinate system is set up, and the positional relationships of the respective members will be described while referring to this XYZ rectangular coordinate system. The prescribed directions within the horizontal plane are the X axis directions, directions orthogonal to the X axis directions within the horizontal plane are the Y axis directions, and directions respectively orthogonal to the X axis and the Y axis directions (that is, the vertical directions) are the Z axis directions. In addition, the directions of rotation (inclination) about the X axis, the Y axis and the Z axis are the θX, the θY and the θZ directions respectively.

Figure 2:
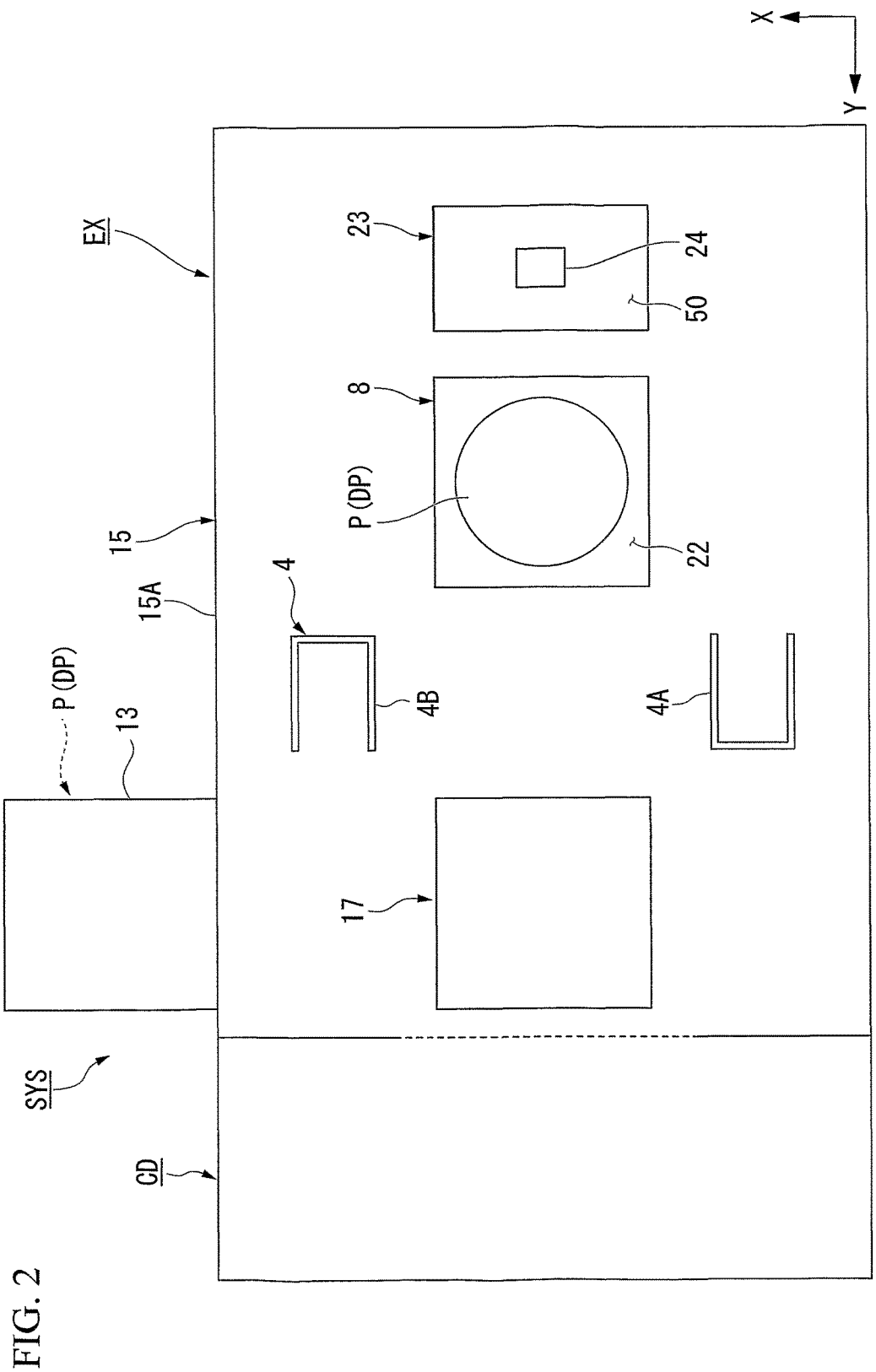
FIG. 2 is a plan view that shows a part of FIG. 1.

FIG. 1 is a schematic block diagram that shows an example of a device manufacturing system SYS that includes an exposure apparatus EX in an embodiment relating to the present invention, and FIG. 2 is a plan view that shows a part of FIG. 1. The exposure apparatus EX of the present embodiment is a liquid immersion exposure apparatus that exposes the substrate P using exposure light EL via a liquid LQ. In the present embodiment, a liquid immersion space LS is formed so that at least a part of the optical path of the exposure light EL is filled with the liquid LQ. The liquid immersion space is a portion (space, region) filled with a liquid. The substrate P is exposed using the exposure light EL via the liquid LQ of the liquid immersion space LS. In the present embodiment, water (pure water) is used as the liquid LQ.

Moreover, the exposure apparatus EX of the present embodiment is an exposure apparatus comprising a substrate stage that holds a substrate P and is able to move and a measuring stage that mounts measuring unit (measuring member), which, without holding the substrate P, measures the exposure light EL, and is able to move, such as those disclosed in, for example, the specification of U.S. Pat. No. 6,897,963 and the specification of European Patent Application Publication No. 1713113.

In FIG. 1 and FIG. 2, the exposure apparatus EX comprises a mask stage 6 that has a mask holding part 5, which releasably holds a mask M, and holds a mask M and is able to move, a substrate stage 8, which has a substrate holding part 7, which releasably holds a substrate P, and holds a substrate P and is able to move, a measuring stage 23, which mounts a measuring stage 24, which, without holding the substrate P, measures exposure light EL, and is able to move, a projection optical system PL, which projects the image of the pattern of the mask M illuminated by the exposure light EL to the substrate P, an interferometer system 16, which measures the positions of the mask stage 6, the substrate stage 8 and the measuring stage 23, an alignment system 19, which detects the alignment marks of the substrate P, a transport system 4, which transports the substrate P, a liquid immersion member 9, which holds a liquid LQ between itself and the substrate P so that the optical path of the exposure light EL irradiated to the substrate P is filled with the liquid LQ, a chamber apparatus 15, which has a chamber member 15A which forms an interior space 14 in which the substrate P is processed, a control apparatus 1 that controls the operations of the entire exposure apparatus EX, and a storage apparatus 2 that is connected to the control apparatus 1 and in which various information relating to exposure is stored.

The mask M includes a reticle on which a device pattern to be projected to the substrate P is formed. The mask M includes a transmitting type mask, for example, which has a transparent plate such as a glass plate and a pattern formed using a light shielding material such as chrome on that transparent plate. Note that it is also possible to use a reflecting type mask as the mask M.

The substrate P is a substrate for manufacturing devices. The substrate P includes, for example, a base material such as a semiconductor wafer such as a silicon wafer and a photosensitive film formed on that base material. The photosensitive film is a film of a photosensitive material (photoresist). In addition, the substrate P may include other films in addition to the photosensitive film. For example, the substrate P may also include a reflection preventing film and may also include a protective film (topcoat film) that protects the photosensitive film.

The exposure apparatus EX is connected to substrate processing apparatus CD. In the present embodiment, the substrate processing apparatus CD includes a coater developer apparatus. The substrate processing apparatus CD includes a film forming apparatus that is able to form a prescribed film on the substrate and a developing apparatus that develops the post-exposure substrate P. The film forming apparatus includes a coating apparatus that is able to form a photosensitive film on the substrate by coating a solution of the photosensitive material to the substrate based on the spin coating method such as that disclosed in, for example, the specification of U.S. Patent Application Publication No. 2006/0068110. The film forming apparatus is able to form not only the photosensitive film but various films such as protective films and reflection preventing films on the substrate.

In the present embodiment, an accommodating apparatus 13, which is able to accommodate the substrate P, is connected to the exposure apparatus EX. The accommodating apparatus 13 is connected at a prescribed position of the chamber apparatus 15. In the present embodiment, the accommodating apparatus 13 includes, for example, a substrate accommodating apparatus called a FOUP (front opening unified pod). The accommodating apparatus 13 is able to accommodate, for example, one lot portion of substrates P (for example, 50 units).

In addition, in the present embodiment, the accommodating apparatus 13 is able to accommodate a dummy substrate DP. The dummy substrate DP is a (clean) member that is separate from the substrate P for exposure, is unlikely to emit foreign matter, and has a high degree of cleanliness. In the present embodiment, the dummy substrate DP is of an external shape that is nearly the same as that of the substrate P. In the present embodiment, the substrate P and the dummy substrate DP are circular plate-shaped members. A substrate holding part 7 is able to hold the dummy substrate DP.

Accommodating apparatus 13 is able to accommodate a plurality of dummy substrates DP. Accommodating apparatus 13 is able to accommodate, for example, the same number (for example 50 units) of dummy substrates DP as the number of substrates P of one lot portion.

In addition, in the present embodiment, the exposure apparatus EX comprises an accommodating apparatus 17 arranged at at least a part of the transport path of the transport system 4 and accommodates the dummy substrate DP. In the present embodiment, accommodating apparatus 17 accommodates a number of dummy substrates DP smaller than the number of dummy substrates DP (for example, 50 units) that accommodating apparatus 13 is able to accommodate. In the present embodiment, accommodating apparatus 17 is able to accommodate two dummy substrates DP. Note that accommodating apparatus 17 may also accommodate a number of dummy substrates DP larger than the number of dummy substrates DP that accommodating apparatus 13 is able to accommodate and may also accommodate the same number of dummy substrates DP. In the following description, accommodating apparatus 17 is referred to as buffer part 17 as appropriate. The buffer part 17 is able to temporarily store dummy substrates DP.

In the present embodiment, the transport system 4 is able to transport the substrate P and the dummy substrate DP respectively. The transport system 4 is able to transport the substrate P between accommodating apparatus 13, the substrate stage 8 (substrate holding part 7) and the substrate processing apparatus CD. In addition, the transport system 4 is able to transport the dummy substrate DP between accommodating apparatus 13, the buffer part 17 and the substrate stage 8 (substrate holding part 7).

In the present embodiment, the transport system 4 comprises a first transport member 4A, which loads the substrate P to the substrate stage 8, and a second transport member 4B, which unloads the substrate P from the substrate stage 8. In the present embodiment, the first transport member 4A is able to transport the dummy substrate DP arranged in the buffer part 17 to the substrate stage 8. The second transport member 4B is able to transport the dummy substrate DP held by the substrate stage 8 to the buffer part 17. In addition, the second transport member 4B is able to transport the dummy substrate DP accommodated in the buffer part 17 to accommodating apparatus 13. In addition, the second transport member 4B is able to transport the dummy substrate DP accommodated in accommodating apparatus 13 to the buffer part 17.

Note that the transport system 4 may also comprise a transport member that is separate from the first and second transport members 4A, 4B. In addition, the transport system 4 may use a transport member that is different from the second transport member 4B to execute transport of the dummy substrate DP between accommodating apparatus 13 and the buffer part 17.

In addition, the exposure apparatus EX comprises a management apparatus 3, which manages the status of usage of the dummy substrate DP. The management apparatus 3 is able to manage the statuses of usage of a respective plurality of dummy substrates DP. Management apparatus 3 includes, for example, a timer, which measures the time during which the dummy substrates DP are to be used, and a counter, which measures the number of times the dummy substrates DP are to be used. The management apparatus 3 is connected to a control apparatus 1.

In addition, predetermined management parameters are stored in the storage apparatus 2. The control apparatus 1 is able to determine the appropriateness of usage of the dummy substrates DP based on the output of the management apparatus 3 and management parameters stored in the storage apparatus 2.

The illumination system IL irradiates exposure light EL to a prescribed illumination region IR. The illumination region IR includes a position that the exposure light EL that emerges from the illumination system IL is able to irradiate. The illumination system IL illuminates at least a part of the mask M arranged in the illumination region IR with exposure light EL with a uniform illumination intensity distribution. Used as the exposure light EL that emerges from the illumination system IL is, for example, deep ultraviolet light (DUV light) such as bright lines (g lines, h lines, i lines) that emerge from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer light, which is ultraviolet light (vacuum ultraviolet light), is used as the exposure light EL.

The mask stage 6 is able to move on a guide surface 18G of a base member 18 that includes the illumination region IR in a status in which the mask M is held by the mask holding part 5. The mask stage 6 is able to move in six directions on the guide surface 18G, which are the X axis, Y axis, Z axis, θX, θY and θZ directions, by means of operation of a drive system that includes a planar motor such as that disclosed in, for example, the specification of U.S. Pat. No. 6,452,292.

The projection optical system PL irradiates exposure light EL to a prescribed projection region PR. The projection region PR includes a position (exposure position) that the exposure light EL emitted from the projection optical system PL is able to irradiate. The projection optical system PL projects an image of the pattern of the mask M to at least a part of the substrate P arranged in the projection region PR at a prescribed projection magnification. The projection optical system PL of the present embodiment is a reduction system whose projection magnification is, for example, a ¼, ⅕ or ⅛. Note that the projection optical system PL may also be a unity magnification system or an enlargement system. In the present embodiment, the optical axis of the projection optical system PL is parallel to the Z axis. In addition, the projection optical system PL may also be any of a dioptric system that does not include a reflecting optical element, a catoptric system that does not include a refracting optical element, or a catadioptric system that includes both a reflecting optical element and a refracting optical element. In addition, the projection optical system PL may also form an erect image or an inverted image.

The projection optical system PL has an emitting surface 11 which emits the exposure light EL toward the image plane of the projection optical system PL. The emitting surface 11 is arranged at the terminal optical element 10 nearest the image plane of the projection optical system PL from among the plurality of optical elements of the projection optical system PL. The projection region PR includes a position to which the exposure light EL that has emitted from the emitting surface 11 is able to irradiate. In the present embodiment, the emitting surface 11 faces the −Z direction and is parallel to the XY plane. Note that the emitting surface 11 that faces the −Z direction may be a convex surface or a concave surface.

In addition, the exposure apparatus EX comprises an imaging characteristics adjustment system PLC that adjusts the imaging characteristics of the projection optical system PL. Examples of the imaging characteristics adjustment system PLC are disclosed in, for example, the specification of U.S. Pat. No. 4,666,273, the specification of U.S. Pat. No.

6,235,438, and the specification of U.S. Patent Application Publication No. 2005/0206850. The imaging characteristics adjustment system PLC of the present embodiment includes a drive apparatus that is able to move some of the plurality of optical elements of the projection optical system PL. The drive apparatus is able to move a specific optical element from among the plurality of optical elements of the projection optical system PL in the optical axis directions (Z axis directions). In addition, the drive apparatus is able to tilt a specific optical element with respect to the optical axis. The imaging characteristics adjustment system PLC adjusts imaging characteristics including various aberrations (such as the projection magnification, distortion and spherical operation) of the projection optical system PL and the image plane position (focus position) by moving specific optical elements of the projection optical system PL. In addition, the imaging characteristics adjustment system PLC is able to adjust the exposure position (position of the projection region PR) by moving the specific optical elements of the projection optical system PL. Note that the imaging characteristics adjustment system may also include a pressure adjusting apparatus that adjusts the pressure of the gas of the space between some of the optical elements held in the interior of the lens barrel that accommodates the optical elements of the projection optical system PL. The imaging characteristics adjustment system PLC is controlled by a control apparatus 1.

The substrate stage 8 is able to move on a guide surface 20G of the base member 20, which includes the projection region PR, in a status in which the substrate P is held by the substrate holding part 7. The substrate holding part 7 releasably holds the substrate P at an exposure position (position of the projection region PR) that the exposure light EL that emerges from the emitting surface 11 is able to irradiate. The substrate stage 8 is able to move in six directions, which are the X axis, Y axis, Z axis, θX, θY and θZ directions, on the guide surface 20G by means of operation of a drive system that includes a planar motor such as that disclosed in, for example, the specification of U.S. Pat. No. 6,452,292.

In the present embodiment, the surface of the substrate P held by the substrate holding part 7 and the upper surface 22 of the substrate stage 8 arranged in the vicinity (periphery, circumference) of that substrate P are arranged within the same plane (flush). The upper surface 22 is flat. In the present embodiment, the surface of the substrate P held by the substrate holding part 7 and the upper surface 22 of the substrate stage 8 are nearly parallel with the XY plane.

Note that the surface of the substrate P held by the substrate holding part 7 and the upper surface 22 may also not be arranged within the same plane, and at least one of the surface of the substrate P and the upper surface 22 may also not be parallel to the XY plane.

Note that the upper surface 22 of the substrate stage 8 may also be the upper surface of a plate member releasably held by the substrate stage as disclosed in, for example, the specification of U.S. Patent Application Publication No. 2007/0177125 and the specification of U.S. Patent Application Publication No. 2008/0049209.

The measuring stage 23 is able to move on the guide surface 20G of the base member 20 including the projection region PR in a status in which a measuring unit 24 (measuring member) has been mounted. The measuring stage 23 is able to move in six directions on the guide surface 20G which are the X axis, Y axis, Z axis, θX, θY and θZ directions, by means of operation of the drive system that includes a planar motor such as that disclosed in, for example, the specification of U.S. Pat. No. 6,452,292.

The measuring unit 24 is able to measure the exposure light EL. In the present embodiment, the measuring unit 24 is at least a part of an aerial image measuring system, which measures an aerial image (imaging characteristics of the projection optical system PL) formed by the projection optical system PL such as that disclosed in, for example, the specification of U.S. Patent Application Publication No. 2002/0041377.

In addition, in the present embodiment, the measuring stage 23 mounts at least a part of an illumination nonuniformity measuring system such as that disclosed in, for example, the specification of U.S. Pat. No. 4,465,368. In addition, the measuring stage 23 mounts at least a part of a measuring system that is able to measure the amount of displacement of the transmittance of the exposure light EL of a projection optical system PL such as that disclosed in, for example, U.S. Pat. No. 6,721,039. In addition, the measuring stage 23 mounts at least a part of an irradiation amount measuring system (illumination intensity measuring system) such as that disclosed in, for example, the specification of U.S. Patent Application Publication No. 2002/0061469. In addition, the measuring stage 23 mounts at least a part of a wave front aberration measuring system such as that disclosed in, for example, the specification of European Patent No. 1079223.

The chamber apparatus 15 comprises a chamber member 15A, which forms an internal space 14 in which the substrate P is processed, and an air conditioning apparatus 15B, which adjusts the environment of that internal space 14. The environment of the internal space 14 includes the temperature, humidity, pressure and degree of cleanliness of the internal space 14. The chamber member 15A forms an internal space 14 that includes the exposure position and is temperature regulated by the air conditioning apparatus 15B. The substrate stage 8 moves in the internal space 14.

The positions of the mask stage 6, the substrate stage 8 and the measuring stage 23 are measured by an interferometer system 16 that includes laser interferometer units 16A, 16B. Laser interferometer unit 16A is able to measure the position of the mask stage 6. Laser interferometer unit 16B is able to measure the positions of the substrate stage 8 and the measuring stage 23. When exposure processing of the substrate P is executed, or when the prescribed measurement processing is executed, the control apparatus 1 executes positional control of the mask stage 6 (mask M), the substrate stage 8 (substrate P) and the measuring stage 23 (measuring unit 24) based on the measurement results of the interferometer system 16.

Note that the exposure apparatus EX may also comprise an encoder system that has a plurality of encoder heads that are able to measure a scale arranged on the upper surface 22 of the substrate stage 8 such as, for example, that disclosed in the specification of U.S. Patent Application Publication No. 2007/0288121.

In addition, before exposure of the substrate P is executed, an alignment mark of the substrate P is detected by an alignment system 19. In the present embodiment, the alignment system 19 is an FIA (field image alignment) type alignment system such as that disclosed in, for example, the specification of U.S. Pat. No. 5,493,403. The alignment system 19 obtains an image of the alignment mark of the substrate P and detects the position of the substrate P (shot regions S1~S21). In addition, the alignment system 19 is able to detect not only the alignment mark of the substrate P but various marks.

Figure 3:
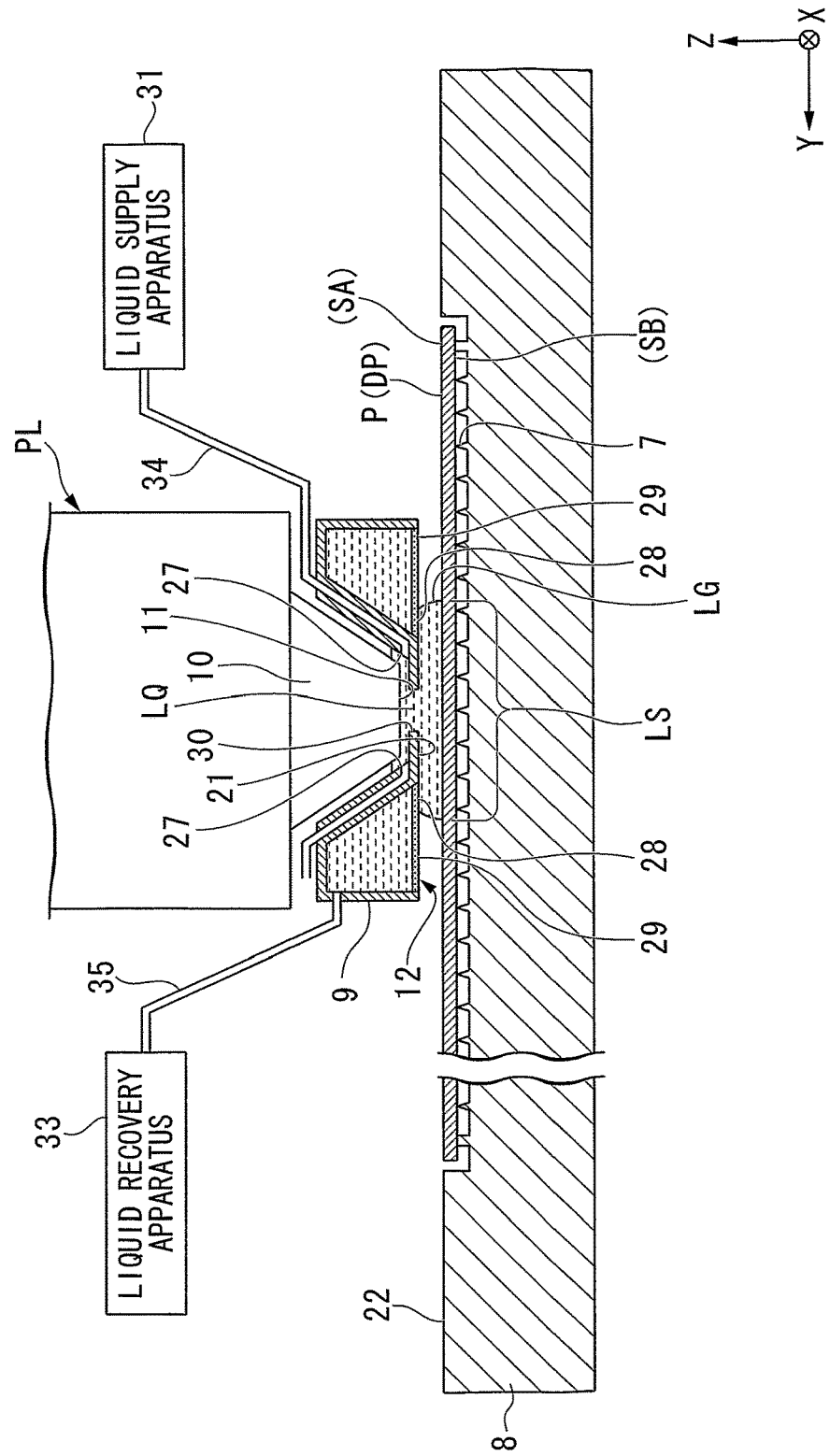
FIG. 3 is a side cross-sectional view that shows an example of a liquid immersion member.

FIG. 3 is a side cross-sectional view that shows an example of the liquid immersion member 9 relating to the present embodiment. The liquid immersion member 9 is able to form a liquid immersion space LS so that at least a part of the optical path of the exposure light EL is filled with the liquid LQ. At least a part of the liquid immersion member 9 is arranged at at least a part of the vicinity of the optical path of the exposure light EL that emerges from the emitting surface 11. In the present embodiment, the liquid immersion member 9 is an annular member as seen from the Z axis direction. In the present embodiment, at least a part of the liquid immersion member 9 is arranged in the vicinity of terminal optical element 10 and the optical path of the exposure light EL.

The liquid immersion space LS is formed so that the optical path of the exposure light EL between the terminal optical element 10 and an object arranged at a position that the exposure light EL that emerges from the terminal optical element 10 is able to irradiate (the position of the projection region PR) is filled with the liquid LQ. The liquid immersion member 9 has a lower surface 12 that that object is able to oppose. The liquid LQ is held between the lower surface 12 and the object so that the optical path of the exposure light EL between the emitting surface 11 and the object is filled with the liquid LQ.

In the present embodiment, the object that can be arranged in the projection region PR is an object that is able to move with respect to the projection region PR at the image plane side of the projection optical system PL (the emitting surface 11 side of the terminal optical element 10) and is an object that is able to move to a position that opposes the emitting surface 11 and the lower surface 12. In the present embodiment, the object that is able to move to a position that opposes the emitting surface 11 and a lower surface 12 includes at least one of the substrate stage 8, the substrate P held by the substrate stage 8, the dummy substrate DP held by the substrate stage 8 and the measuring stage 23.

The lower surface 12 of the liquid immersion member 9 is able to hold the liquid LQ between itself and the surface of the object (at least one of the upper surface 22 of the substrate stage 8, the surface of the substrate P held by the substrate stage 8, the surface of the dummy substrate DP held by the substrate stage 8, and the upper surface 50 of the measuring stage 23). The liquid immersion member 9 forms a liquid immersion space LS by holding the liquid LQ between the lower surface 12 and the surface of the object so that the optical path of the exposure light EL between the emitting surface 11 and the surface of the object (upper surface) is filled with the liquid LQ. By means of the liquid LQ being held between the emitting surface 11 and the lower surface 12 of one side and the surface (upper surface) of the object of the other side, a liquid immersion space LS is formed so that the optical path of the exposure light EL between the terminal optical element 10 and the object is filled with the liquid LQ.

In the present embodiment, the liquid immersion space LS is formed so that, when the exposure light EL is irradiated to the substrate P, the region of a part of the surface of the substrate P that includes the projection region PR is covered with the liquid LQ. At least a part of the interface (meniscus, edge) LG of the liquid LQ is formed between the lower surface 12 of the liquid immersion member 9 and the surface of the substrate P. Specifically, the exposure apparatus EX of the present embodiment employs a local liquid immersion system.

Here, in a description that uses FIG. 3, the case in which the substrate P is arranged in the projection region PR (a position that opposes the terminal optical element 10 and the liquid immersion member 9) will be described as an example, but, as discussed above, at least one of the substrate stage 8, the dummy substrate DP and the measuring stage 23 can be arranged.

As shown in FIG. 3, the liquid immersion member 9 has an opening 30 at a position that opposes the emitting surface 11. The exposure light EL that has emitted from the emitting surface 11 passes through the opening 30 and is able to irradiate to the substrate P. In addition, the liquid immersion member 9 is arranged in the vicinity of the opening 30 and has a flat surface 21 that is able to oppose the surface of the substrate P. The flat surface 21 holds the liquid LQ between itself and the surface of the substrate P. At least a part of the lower surface 12 of the liquid immersion member 9 includes the flat surface 21.

The liquid immersion member 9 comprises a supply port 27, which is able to supply the liquid LQ, and a recovery port 28, which is able to recover the liquid LQ. The supply port 27 supplies the liquid LQ in at least a part of the exposure of the substrate P. The recovery port 28 recovers the liquid LQ in at least a part of the exposure of the substrate P.

The supply port 27 is arranged in the vicinity of the optical path of the exposure light EL so as to face that optical path. The supply port 27 is connected to a liquid supply apparatus 31 via a supply passageway 34. The liquid supply apparatus 31 is able to send out liquid LQ that is clean and has been temperature regulated. The supply passageway 34 includes a passageway formed by the internal passageway of the liquid immersion member 9 and a supply tube that connects that internal passageway and the liquid supply apparatus 31. The liquid LQ that has been sent from the liquid supply apparatus 31 is supplied to the supply port 27 via the supply passageway 34.

The recovery port 28 is able to recover at least a part of the liquid LQ on the substrate P (object) that opposes the lower surface 12 of the liquid immersion member 9. In the present embodiment, the recovery port 28 is arranged in the vicinity of the flat surface 21. The recovery port 28 is arranged at a prescribed position of the liquid immersion member 9 that opposes the surface of the substrate P. A plate-shaped porous member 29 that includes a plurality of holes (holes, openings or pores) is arranged in the recovery port 28. Note that a mesh filter, which is a porous member in which many small holes are formed in a mesh shape, may also be arranged in the recovery port 28. In the present embodiment, the lower surface 12 of the liquid immersion member 9 includes the lower surface of the porous member 29. In at least a part of the exposure of the substrate P, the lower surface of the porous member 29 faces the substrate P. The liquid LQ on the substrate P is recovered via the holes of the porous member 29.

The recovery port 28 is connected with the liquid recovery apparatus 33 via the recovery passageway 35. The liquid recovery apparatus 33 is able to connect the recovery port 28 to a vacuum system and is able to suction the liquid LQ via the recovery port 28. The recovery passageway 35 includes a passageway formed by the internal passageway of the liquid immersion member 9 and a recovery tube that connects that internal passageway and the liquid recovery apparatus 33. The liquid LQ recovered from the recovery port 28 is recovered by the liquid recovery apparatus 33 via the recovery passageway 35.

In the present embodiment, the control apparatus 1, by executing the recovery operation of the liquid LQ from the recovery port 28 in parallel with the supply operation of the liquid LQ from the supply port 27, is able to form a liquid immersion space LS with the liquid LQ between the terminal optical element 10 and liquid immersion member 9 of one side and the object of the other side.

Note that it is possible to use, for the liquid immersion member 9, a liquid immersion member (nozzle member) such as that disclosed in, for example, the specification of U.S. Patent Application Publication No. 2007/0132976 and the specification of European Patent Application Publication No. 1768170.

Figure 4:
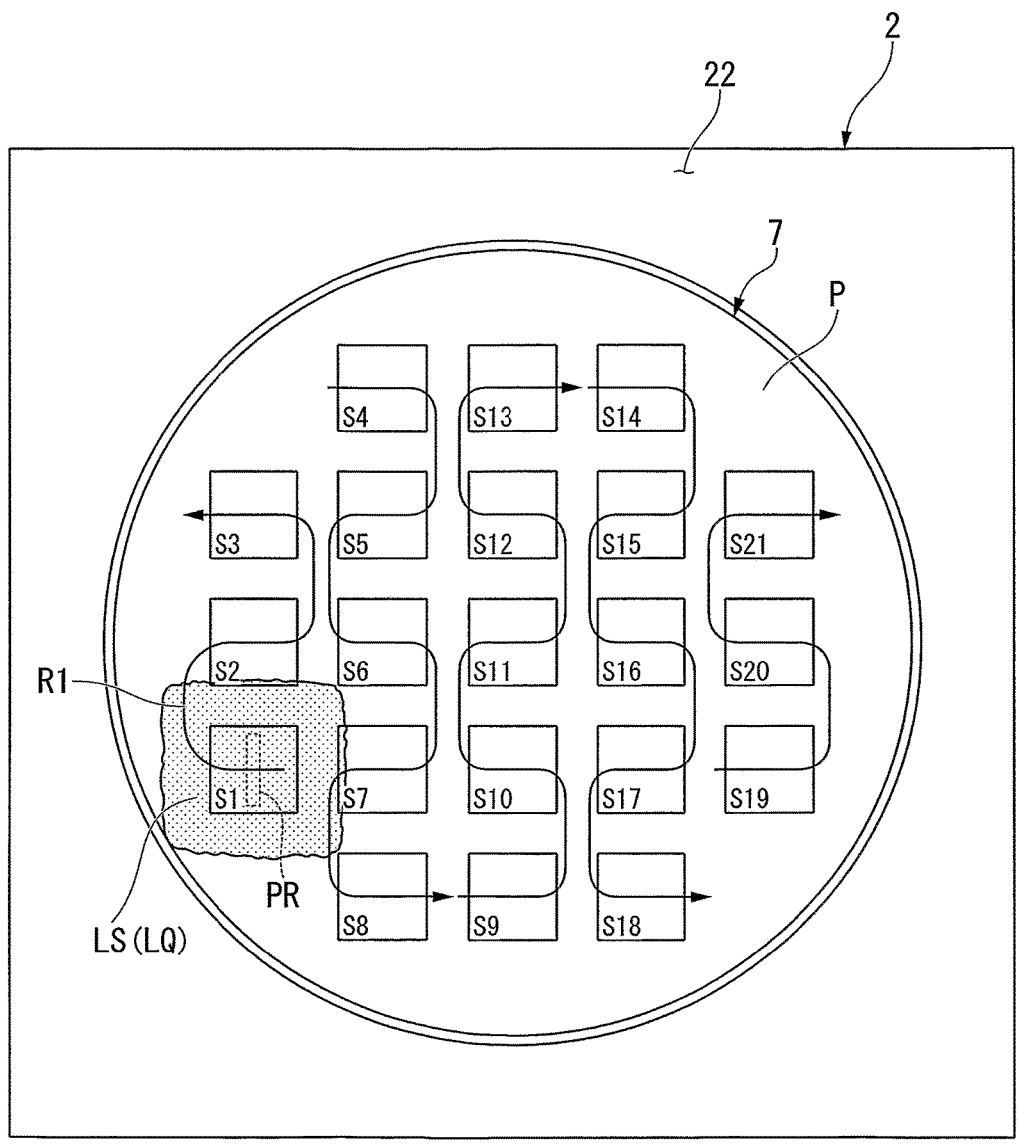
FIG. 4 is a schematic view that shows an example of operation of an exposure apparatus.
Figure 4:
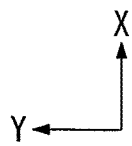

Next, an example of operation of the exposure apparatus EX at the time of exposure of the substrate P will be described. FIG. 4 is a plan view of the substrate P held by the substrate stage 8. In exposure of the substrate P, the substrate P is held by the substrate holding part 7. In addition, the liquid LQ is held between the liquid immersion member 9 and the substrate P so that the optical path of the exposure light EL irradiated from the substrate P is filled with the liquid LQ. As shown in FIG. 4, the plurality of shot regions S1~S21, which are the regions subject to exposure, are set in a matrix manner on the substrate P. In addition, as shown in FIG. 4, in the present embodiment, the projection region PR is a slit manner with the X axis directions as the lengthwise directions.

The exposure apparatus EX of the present embodiment is a scanning type exposure apparatus (a so-called scanning stepper) that synchronously moves the mask M and the substrate P in prescribed scanning directions while projecting the image of patterns of the mask M to the substrate P. At the time of exposure of the shot regions S1~S21 of the substrate P, the mask M and the substrate P are moved in prescribed scanning directions within the XY plane. In the present embodiment, the scanning directions of the substrate P (synchronous movement directions) are the Y axis directions, and the scanning directions (synchronous movement directions) of the mask M are also the Y axis directions. The control apparatus 1 synchronously moves the mask stage 6 (mask holding part 5), which holds the mask M, and the substrate stage 8 (substrate holding part 7), which holds the substrate 8, in the Y axis directions with respect to the optical path of the exposure light EL.

The control apparatus 1 controls the mask stage 6 and the substrate stage 8 to move the shot regions S1~S21 of the substrate P in the Y axis directions with respect to the projection region PR while moving the pattern forming region of the mask M in the Y axis directions with respect to the illumination region IR in synchronization with movement of that substrate P in the Y axis directions while irradiating the exposure light EL to the substrate P via the projection optical system PL and the liquid LQ of the liquid immersion space LS. Through this, the shot regions S1~S21 of the substrate P held by the substrate holding part 7 are exposed with the exposure light EL that has emitted from the emitting surface 11 of the projection optical system PL via the liquid LQ, and the image of the pattern of the mask M is projected to the shot regions S1~S21 of the substrate P.

When the respective shot regions S1~S21 are exposed, the control apparatus 1 controls the substrate stage 8 to move the substrate P in the Y axis directions with respect to the projection region PR (terminal optical element 10). In addition, after exposure of a certain shot region (for example, the first shot region S1) has ended, in order to perform exposure of the next shot region (for example, the second shot region S2), the control apparatus 1 controls the substrate stage 8 to move the substrate P in a prescribed direction within the XY plane with respect to the terminal optical element 10 so that the projection region PR is arranged at the exposure start position of the next shot region in a status in which emergence of the exposure light EL from the terminal optical element 10 is stopped.

In the present embodiment, the control apparatus 1 moves the terminal optical element 10 and the substrate P (the substrate stage 8) relatively so that the projection region PR moves along, for example, arrow R1 in FIG. 4 while emitting the exposure light EL from the emitting surface 11 of the terminal optical element 10 to irradiate the exposure light EL to the projection region PR and sequentially expose the respective shot regions S1~S21 on the substrate P.

In the following description, the movement trajectory of the substrate stage 8 that moves along arrow R1 is called the movement trajectory R1 as appropriate.

Figure 5:
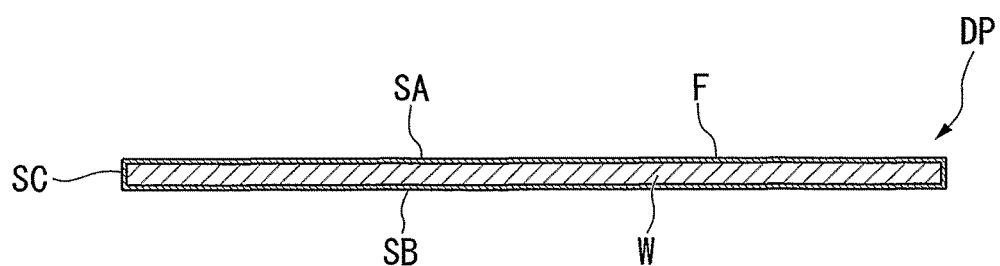
FIG. 5 is a side cross-sectional view that shows an example of a dummy substrate.
Figure 6:
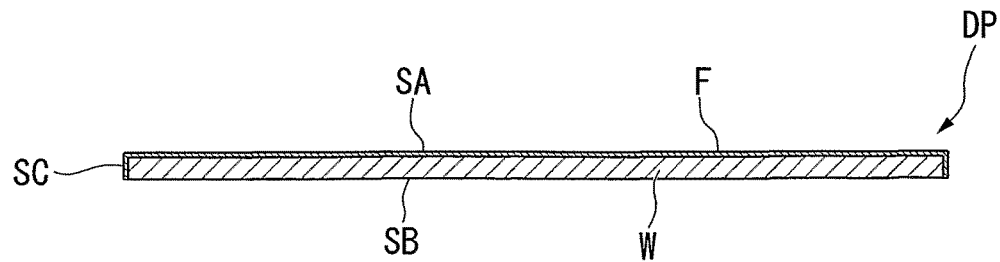
FIG. 6 is a side cross-sectional view that shows an example of a dummy substrate.

Next, FIG. 5 and FIG. 6 will be referred to describe the dummy substrate DP. FIG. 5 and FIG. 6 are side cross-sectional views that show an example of the dummy substrate DP relating to the present embodiment. As discussed above, the dummy substrate DP has nearly the same external shape as the substrate P. The substrate holding part 7 is able to hold the dummy substrate DP. When the dummy substrate DP is held by the substrate holding part 7, at least part of the surface of the dummy substrate DP opposes the substrate holding part 7. In the description below, at least the part of the surface of the dummy substrate DP that opposes the substrate holding part 7 is referred to as the lower surface SB of the dummy substrate DP as appropriate, and at least the part of the surface of the dummy substrate DP that faces the direction opposite lower surface SB is referred to as the upper surface SA of the dummy substrate DP as appropriate. The substrate holding part 7 holds the lower surface SB of the dummy substrate DP.

In a status in which the dummy substrate DP is held by the substrate holding part 7, the upper surface 22 of the substrate stage 8 is arranged in the vicinity of the upper surface SA of the dummy substrate DP. In a status in which the dummy substrate DP is held by the substrate holding part 7, the upper surface SA of the dummy substrate DP and the upper surface 22 of the substrate stage 8 are arranged in nearly the same plane (nearly flush). In addition, in a status in which the dummy substrate DP is held by the substrate holding part 7, the upper surface SA of the dummy substrate DP is able to oppose the lower surface 11 of the terminal optical element 10 and the lower surface 12 of the liquid immersion member 9.

As shown in FIG. 5, in the present embodiment, the dummy substrate DP includes a base material W and a film F formed at least at a part of the surface of that base material W. In the present embodiment, the upper surface SA and the lower surface SB of the dummy substrate DP and the respective side surfaces SC that join the upper surface SA and the lower surface SB are the surfaces of the film F. Note that, as shown in FIG. 6, the upper surface SA and the side surfaces SC may be the surface of the film F, and the lower surface SB may be the surface of the base material W. Or, the upper surface SA may be the surface of the film F, and the side surfaces SC and the lower surface SB may be the surface of the base material W.

In present embodiment, the base material W of the dummy substrate DP is the same as the base material of the substrate P for device manufacture. In the present embodiment, the base material W of the dummy substrate DP is a silicon wafer (a so-called bare wafer).

In the present embodiment, the film F is lyophobic with respect to the liquid LQ. In the present embodiment, the film F is formed by a resin that includes fluorine (fluorine group resin). In the present embodiment, the film F is formed by Teflon®. Note that, the film F may also be a silicon carbon nitride film (SiCN) formed by the CVD method.

Next, an example of operation of an exposure apparatus EX having the configuration discussed above will be described while referring to the flow chart of FIG. 7 and the schematic views of FIG. 8 and FIG. 9.

In the present embodiment, the prescribed processing is executed using the dummy substrate DP. Processing that uses the dummy substrate DP includes at least one of adjustment processing that adjusts a prescribed apparatus (substrate stage 8, projection optical system PL, etc.) of the exposure apparatus EX and maintenance processing that maintains a prescribed member (liquid immersion member 9, terminal optical element 10, etc.) of the exposure apparatus EX.

In the present embodiment, prescribed processing that includes adjustment processing and maintenance processing is executed in a status in which the dummy substrate DP is held by the substrate holding part 7.

In the present embodiment, adjustment processing includes at least one of processing that adjusts the amount of irradiation of the exposure light EL that emerges from the emitting surface 11 of the projection optical system PL and processing that adjusts the projection optical system PL in a status in which the dummy substrate DP is held by the substrate holding part 7. In addition, adjustment processing includes processing that adjusts synchronous movement error of the mask stage 6 and the substrate stage 8 in a status in which the dummy substrate DP is held by the substrate holding part 7.

In the present embodiment, maintenance processing includes at least one of processing that cleans at least a part of the liquid immersion member 7 and processing that photo-cleans at least a part of the projection optical system PL using the exposure light EL in a status in which the dummy substrate DP is held by the substrate holding part 7.

Figure 7:
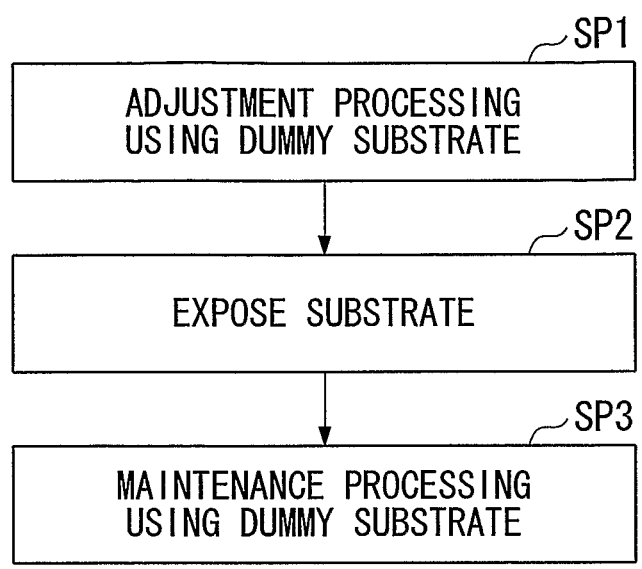
FIG. 7 is a flow chart that shows an example of operation of an exposure apparatus.

As shown in FIG. 7, the exposure method of the present embodiment includes holding of the dummy substrate DP using the substrate holding part 7 to use the dummy substrate DP to execute adjustment processing of a prescribed apparatus (step SP1), exposing of the substrate P held by the substrate holding part 7 with the exposure light EL (step SP2), and holding of the dummy substrate DP using the substrate holding part 7 to use the dummy substrate DP to execute maintenance processing of a prescribed member (step SP3).

In the present embodiment, the dummy substrate DP is accommodated in advance in the buffer part 17 prior to the prescribed processing that uses the dummy substrate DP being executed. The control apparatus 1 selects, from among a plurality (for example, 50 units) of dummy substrates DP accommodated in the accommodating apparatus 13, two dummy substrates DP and accommodates those two dummy substrates DP in the buffer part 17 using the transport system 4.

In the present embodiment, usage of the dummy substrates DP includes usage in a status in which holding by the substrate holding part 17 has been performed. In the case in which the prescribed processing that uses the dummy substrates DP is to be executed, the control apparatus 1 uses the transport system 4 to load the dummy substrates DP accommodated in the buffer part 17 to the substrate holding part 7.

The control apparatus 1, in order to execute adjustment processing that uses the dummy substrates DP, selects one dummy substrate DP from among the two dummy substrates DP accommodated in the buffer part 17 and loads the selected dummy substrate DP to the substrate holding part 7 using the transport system 4. The substrate holding part 7 holds that dummy substrate DP.

The control apparatus 1, after the dummy substrate DP has been held by the substrate holding part 7, uses the dummy substrate DP held by that substrate holding part 7 to start adjustment processing (step SP1).

Figure 8:
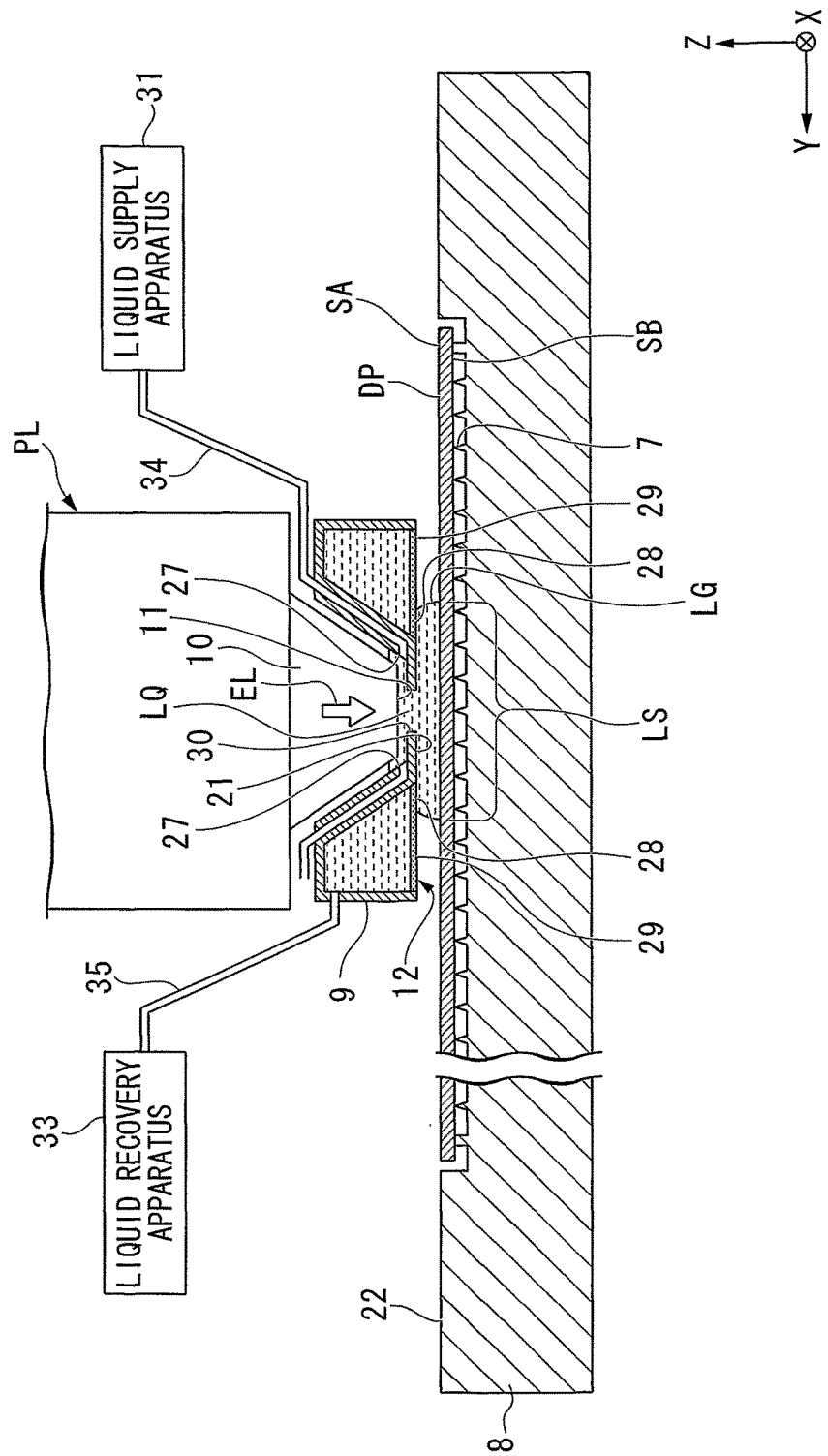
FIG. 8 is a schematic view that shows an example of operation of an exposure apparatus.

FIG. 8 shows an example of the status in which adjustment processing of the amount of irradiation of the exposure light EL that emerges from the emitting surface 11 of the projection optical system PL is being executed. As shown in FIG. 8, adjustment processing of the amount of irradiation of the exposure light EL is executed in a status in which the emitting surface 11 of the projection optical system PL and the dummy substrate DP held by the substrate holding part 7 have been placed in opposition. The control apparatus 1 emits the exposure light EL from the emitting surface 11 while adjusting the amount of irradiation of the exposure light EL that emerges from the emitting surface 11 in a status in which the emitting surface 11 and the dummy substrate DP have been placed in opposition. The exposure light EL that has emitted from the emitting surface 11 is irradiated to the dummy substrate DP. In the present embodiment, an irradiation amount sensor that is able to measure the amount of irradiation of the exposure light EL is arranged in the illumination system IL. The exposure light EL that has emitted from the light source of the exposure light EL and has passed through the illumination system IL is incident to the projection optical system PL, is emitted from the emitting surface 11 via a plurality of optical elements of that projection optical system PL, and is irradiated to the dummy substrate DP. The control apparatus 1 measures the amount of irradiation of the exposure light EL that is being emitted from the light source of the exposure light EL and passes through the illumination system IL using an irradiation amount sensor arranged in the illumination system IL. The control apparatus 1 is able to derive the amount of irradiation of the exposure light EL that emerges from the emitting surface 11 based on the measurement results of that irradiation amount sensor. The control apparatus 1 is able to adjust the amount of irradiation of the exposure light EL by, for example, adjusting the output of the light source (in the present embodiment, the ArF excimer laser apparatus) based on the measurement results of that irradiation amount sensor.

In this way, in the present embodiment, usage of the dummy substrate DP includes usage in a status in which placing in opposition with the emitting surface 11 has been performed. Usage of the dummy substrate DP includes irradiating the exposure light EL that has emitted from the emitting surface 11 to the dummy substrate DP. In the present embodiment, in adjustment processing of the amount of irradiation of the exposure light EL, the exposure light EL is irradiated to the dummy substrate DP, so it is possible to prevent the exposure light EL from unfortunately being irradiated to an undesirable part of the exposure apparatus EX. For example, in adjustment processing, when the exposure light EL is unfortunately irradiated to the upper surface 22 of the substrate stage 8 or the upper surface 50 of the measuring stage 23, there is a possibility that these upper surfaces 22, 50 will unfortunately deteriorate due to irradiation of the exposure light EL. In the present embodiment, it is possible to restrict deterioration of upper surfaces 22, 50, etc. due to irradiation of the exposure light EL by irradiating the exposure light EL to the dummy substrate DP.

In addition, as shown in FIG. 8, adjustment processing of the amount of irradiation of the exposure light EL is executed in a status in which the liquid LQ is held between the terminal optical element 10 and liquid immersion member 9 and the dummy substrate DP held by the substrate holding part 7. In this way, in the present embodiment, usage of the dummy substrate DP includes holding of the liquid LQ in the space with respect to the terminal optical element 10 and the liquid immersion member 9.

Next, an example of processing in which the dummy substrate DP is used to adjust the projection optical system PL will be described. Adjustment processing of the projection optical system PL is executed in a status in which the emitting surface 11 of the projection optical system PL and the dummy substrate DP held by the substrate holding part 7 have been placed in opposition. The control apparatus 1 moves the substrate stage 8 along the movement trajectory R1 while emitting the exposure light EL from the emitting surface 11 of the projection optical system PL as was described while referring to FIG. 4, in a status in which the dummy substrate DP is held by the substrate holding part 7. Specifically, the control apparatus 1 moves the substrate stage 8 along the movement trajectory R1 while emitting the exposure light EL from the emitting surface 11 of the projection optical system PL in a status in which the emitting surface 11 and the dummy substrate DP held by the substrate holding part 7 have been placed in opposition. The exposure light EL that has emitted from the emitting surface 11 of the projection optical system PL is irradiated to the dummy substrate DP. The control apparatus 1, in a status in which the emitting surface 11 and the dummy substrate DP have been placed in opposition so that the exposure light EL is irradiated to the shot regions S1~S21 that have been virtually set on the dummy substrate DP, moves that dummy substrate DP along the movement trajectory R1 while emitting the exposure light EL from the emitting surface 11. Specifically, the control apparatus 1 sequentially exposes (dummy exposes) the shot regions S1~S21 that have been virtually set on the dummy substrate DP.

In the present embodiment, dummy exposure for adjustment processing of the projection optical system PL is executed in a status in which the liquid LQ is held between the terminal optical element 10 and liquid immersion member 9 and a dummy substrate DP held by the substrate holding part 7.

After dummy exposure has ended, the control apparatus 1 controls the positions of the substrate stage 8 and the measuring stage 23 with respect to the projection optical system PL to arrange the measuring unit 24 of the measuring stage 23 at a position that opposes the emitting surface 11. The control apparatus 1 emits the exposure light EL from the emitting surface 11 of the projection optical system PL to irradiate the exposure light EL to the measuring unit 24. As discussed above, in the present embodiment, the measuring unit 24 includes a spatial image measuring system and is able to measure a spatial image (imaging characteristics of the projection optical system PL) formed by the projection optical system PL. The control apparatus 1 controls the imaging characteristics adjustment system PLC based on the measurement results of the measuring unit 24. Specifically, the control apparatus 1 uses the imaging characteristics adjustment system PLC to adjust the imaging characteristics of the projection optical system PL based on the measurement results of the measuring unit 24 so that projection optical system PL comes to have the expected imaging characteristics.

In this way, in the present embodiment, usage of the dummy substrate DP includes at least one of adjustment of the amount of irradiation of the exposure light EL and adjustment of the projection optical system PL in a status in which placing in opposition with the emitting surface 11 has been performed.

In the case in which the imaging characteristics of the projection optical system PL are measured using the measuring unit 24, the measuring stage 23 is arranged at a prescribed position with respect to the terminal optical element 10 and the liquid immersion member 9, the liquid LQ is held between the terminal optical element 10 and liquid immersion member 22

In this way, in the present embodiment, usage of the dummy substrate DP includes holding of the liquid LQ in the space with respect to the terminal optical element 10 and the liquid immersion member 9. In addition, as discussed above, in dummy exposure, the dummy substrate DP moves along the movement trajectory R1 in a status in which placing in opposition with the terminal optical element 10 and the liquid immersion member 9 has been performed. In this way, usage of the dummy substrate DP includes moving in a status in which placing in opposition with the terminal optical element 10 and the liquid immersion member 9 has been performed.

In the present embodiment, in adjustment processing of the projection optical system PL, measurement of the imaging characteristics of the projection optical system PL is executed after dummy exposure is executed using the dummy substrate DP, so it is possible to accurately measure the imaging characteristics of the projection optical system PL under the same exposure conditions as exposure (actual exposure) with respect to the substrate P for manufacturing devices. Therefore, it is possible to favorably adjust the projection optical system PL to the expected imaging characteristics based on those measurement results. In dummy exposure, by using a dummy substrate DP rather than the substrate P for manufacturing devices, it is possible to prevent the substrate P from being used wastefully. In addition, as discussed above, in dummy exposure, the dummy substrate DP comes into contact with the liquid LQ. The dummy substrate DP is less likely to emit foreign matter than the substrate P, so, in adjustment processing, it is possible to restrict the liquid LQ from becoming polluted and the terminal optical element 10 and the liquid immersion member 9, etc. that come into contact with liquid LQ from becoming polluted.

Next, an example of processing in which synchronous movement error between the mask stage 6 and the substrate stage 8 is adjusted using the dummy substrate DP will be described. Adjustment processing of synchronous movement error of the mask stage 6 and the substrate stage 8 is also executed in a status in which the emitting surface 11 of the projection optical system PL and the dummy substrate DP held by the substrate holding part 7 have been placed in opposition.

The control apparatus 1 executes processing that adjusts synchronous movement error of the mask stage 6 and the substrate stage 8 in a status in which the dummy substrate DP is held by the substrate holding part 7. Specifically, the mask stage 6 and the substrate stage 8 are synchronously moved under the same movement conditions as during exposure of the substrate P in a status in which a dummy substrate DP that has nearly the same external shape and weight as the substrate P is held by the substrate holding part 7 while the mask M is held by the mask holding part 5. The control apparatus 1 moves the substrate stage 8 along the movement trajectory R1 in a status in which the dummy substrate DP is held by the substrate holding part 7. The dummy substrate DP moves within the XY plane in a status in which placing in opposition with the terminal optical element 10 and the liquid immersion member 9 has been performed. The control apparatus 1 measures the position of the mask stage 6 and the substrate stage 8 using an interferometer system 16 while synchronously moving the mask stage 6 and the substrate stage 8. Through this, synchronous movement error of the mask stage 6 and the substrate stage 8 is measured, and it is possible to adjust (correct) synchronous movement error based on those measurement results. An example of the technique of adjusting the synchronous movement error is disclosed in, for example, the WO 2005/036620 pamphlet.

In this way, usage of the dummy terminal DP includes adjusting the synchronous movement error of the mask stage 6 (mask holding part 5) and the substrate stage 8 (substrate holding part 7) in a status in which the dummy substrate DP is held by the substrate holding part 7.

Note that, for adjustment processing, the exposure light EL may be emitted from the emitting surface 11 in a status in which the emitting surface 11 and the dummy substrate DP have been placed in opposition while, for example, the environment of the internal space 14 that uses the chamber apparatus 15 is adjusted.

After adjustment processing has ended, the control apparatus 1 starts exposure of the substrate P (step SP2). The control apparatus 1 uses the transport system 4 to unload the dummy substrate DP from the substrate holding part 7 and load the pre-exposure substrate P to the substrate holding part 7. The dummy substrate DP that has been unloaded from the substrate holding part 7 is transported to at least one of the buffer part 17 and the accommodating apparatus 13.

After the pre-exposure substrate P has been loaded to the substrate stage 8, the control apparatus 1 moves the substrate stage 8 to the projection region PR and holds the liquid LQ between at least a part of the lower surface 12 of the liquid immersion member 9 and the surface of the substrate P so that the optical path of the exposure light EL that emerges from the emitting surface 11 is filled with the liquid LQ to form a liquid immersion space LS. In the present embodiment, as disclosed in, for example, the specification of U.S. Patent Application Publication No. 2006/0023186 and the specification of U.S. Patent Application Publication No. 2007/0127006, the control apparatus 1 places in opposition at least one of the upper surface 22 of the substrate stage 8 and the upper surface 50 of the measuring stage 23 and the emitting surface 11 of the terminal optical element 10 and the lower surface 12 of the liquid immersion member 9 while being able to synchronously move the substrate stage 8 and the measuring stage 23 in the XY directions with respect to the terminal optical element 10 and the liquid immersion member 9 in a status in which the upper surface 22 of the substrate stage 8 and the upper surface 50 of the measuring stage 23 have been caused to approach or to come in contact so that a space that is able to hold the liquid LQ between at least one of the substrate stage 8 and the measuring stage 23 and the terminal optical element 10 and liquid immersion member 9 continues to be formed. Through this, the control apparatus 1 is able to change from one of the status in which a liquid immersion space LS can be formed between the terminal optical element 10 and liquid immersion member 9 and the substrate stage 8 and a status in which a liquid immersion space LS can be formed between the terminal optical element 10 and liquid immersion member 9 and the measuring stage 23 to the other. Specifically, the control apparatus 1 is able to move the substrate stage 8 and the measuring stage 23 with respect to the liquid immersion member 9 so that leakage of the liquid LQ is restricted while the liquid immersion space LS formed at the lower surface 12 side of the liquid immersion member 9 moves in the space with respect to above the upper surface 22 of the substrate stage 8 and above the upper surface 50 of the measuring stage 23.

In the description below, operation in which the substrate stage 8 and the measuring stage 23 are caused to synchronously move in the XY directions with respect to the terminal optical element 10 and the liquid immersion member 9 in a status in which the upper surface 22 of the substrate stage 8 and the upper surface 50 of the measuring stage 23 are caused to approach or come into contact is called scrum movement as appropriate.

After the liquid immersion space LS is formed between the terminal optical element 10 and liquid immersion member 9 and the substrate stage 8 (the substrate P) so that scrum movement is executed and the optical path of the exposure light EL that emerges from the emitting surface 11 is filled with the liquid LQ, the control apparatus 1 starts exposure processing of the substrate P. When exposure processing of the substrate P is executed, the control apparatus 1 places the terminal optical element 10 and the liquid immersion member 9 in opposition with the substrate stage 8 and forms a liquid immersion space LS so that the optical path of the exposure light EL between the terminal optical element 10 and the substrate P is filled with the liquid LQ. The control apparatus 1 irradiates the exposure light EL from the mask M that has been illuminated by the exposure light EL by means of the illumination system IL to the substrate P via the projection optical system PL and the liquid LQ of the liquid immersion space LS. Through this, the substrate P is exposed using the exposure light EL, and the image of the pattern of the mask M is projected to the substrate P. In exposure of the substrate P, the control apparatus 1, as shown in FIG. 4, moves the substrate stage 8 along the movement trajectory R1 while sequentially exposing the respective shot regions S1~S21 of the substrate P.

After exposure processing of the substrate P has ended, the control apparatus 1 executes scrum movement to form the liquid immersion space LS between the terminal optical element 10 and liquid immersion member 9 and the measuring stage 23 and moves the substrate stage 8 to the substrate exchange position. The control apparatus 1 unloads post-exposure substrate P from the substrate stage 8, which has moved to the substrate exchange position, and loads a pre-exposure substrate P to the substrate stage 8.

Thereafter, the control apparatus 1 repeats the processing discussed above to sequentially expose a plurality of substrates P.

The control apparatus 1 starts maintenance processing using the dummy substrate DP at a prescribed timing (step SP3).

An example of the case in which maintenance processing of the liquid immersion member 9 is executed will be described below. In exposure of the substrate P, there is a possibility that a substance (for example, an organic substance such as a photosensitive material) generated (eluted) from the substrate P will mix into the liquid LQ of the liquid immersion space LS as foreign matter (pollutants, particles). In addition, there is also a possibility that not only substances generated from the substrate P but, for example, foreign matter that floats in the air will mix into the liquid LQ of the liquid immersion space LS. When foreign matter mixes into the liquid LQ of the liquid immersion space LS, there is a possibility that foreign matter will adhere to at least the part of the lower surface 12 of the liquid immersion member 9 that comes into contact with that liquid LQ.

Therefore, in the present embodiment, the control apparatus 1, during non-exposure of the substrate P, uses a dummy substrate DP to execute maintenance processing of at least a part of the lower surface 12 of the liquid immersion member 9. Maintenance processing includes cleaning processing of at least a part of the liquid immersion member 9 in a status in which the liquid immersion member 9 and the dummy substrate DP held by the substrate holding part 7 have been placed in opposition.

The control apparatus 1, in order to execute maintenance processing that uses the dummy substrate DP, selects one dummy substrate DP from among the two dummy substrates DP accommodated in the buffer part 17 and loads that selected dummy substrate DP to the substrate holding part 7 using the transport system 4. The substrate holding part 7 holds that dummy substrate DP.

The control apparatus 1, after the dummy substrate DP has been held by the substrate holding part 7, uses that dummy substrate DP held by the substrate holding part 7 to start maintenance processing.

An example of processing that cleans the liquid immersion member 9 as maintenance processing will be described below. The cleaning processing of the liquid immersion member 9 is executed in a status in which the lower surface 12 of the liquid immersion member 9 and the dummy substrate DP held by the substrate holding part 7 have been placed in opposition. In the present embodiment, in order to clean at least a part of the liquid immersion member 9, a first cleaning mode and a second cleaning mode are put into place.

First, the first cleaning mode will be described. The first cleaning mode is a mode that cleans at least a part of the liquid immersion member 9 by moving the substrate stage 8 within the XY plane in a status in which the liquid LQ is held between the terminal optical element 10 and liquid immersion member 9 and the dummy substrate DP held by the substrate holding part 7 to form a liquid immersion space LS. The control apparatus 1 executes the recovery operation of the liquid LQ from a recovery port 28 in parallel with the supply operation of the liquid LQ from a supply port 27 and moves, for example, the substrate stage 8 along a movement trajectory R1 in a status in which the liquid LQ is held between the terminal optical element 10 and liquid immersion member 9 and the dummy substrate DP held by the substrate holding part 7 to form a liquid immersion space LS. Through this, cleaning of at least a part of the lower surface 12 of the liquid immersion member 9 is performed. In addition, foreign matter that has been peeled from the lower surface 12 is recovered from the recovery port 28 along with the liquid LQ.

Next, the second cleaning mode will be described. The second cleaning mode is a mode that cleans at least a part of the liquid immersion member 9 by holding a cleaning liquid LC between the terminal optical element 10 and liquid immersion member 9 and the dummy substrate DP held by the substrate holding part 7 to form a liquid immersion space LSC using that cleaning liquid LC. In the present embodiment, the supply port 27 is able to supply a cleaning liquid LC that is different from the liquid LQ. In the present embodiment, an alkali cleaning solution is used as the cleaning liquid LC. In the present embodiment, an alkali aqueous solution is used as the cleaning liquid LC. In the present embodiment, the cleaning liquid LC includes a tetramethyl ammonium hydroxide (TMAH) aqueous solution. Note that the cleaning liquid LC may also be an alcohol. For example, the cleaning liquid LC may also be at least one of ethanol, isopropyl alcohol (IPA) and pentanol.

Figure 9:
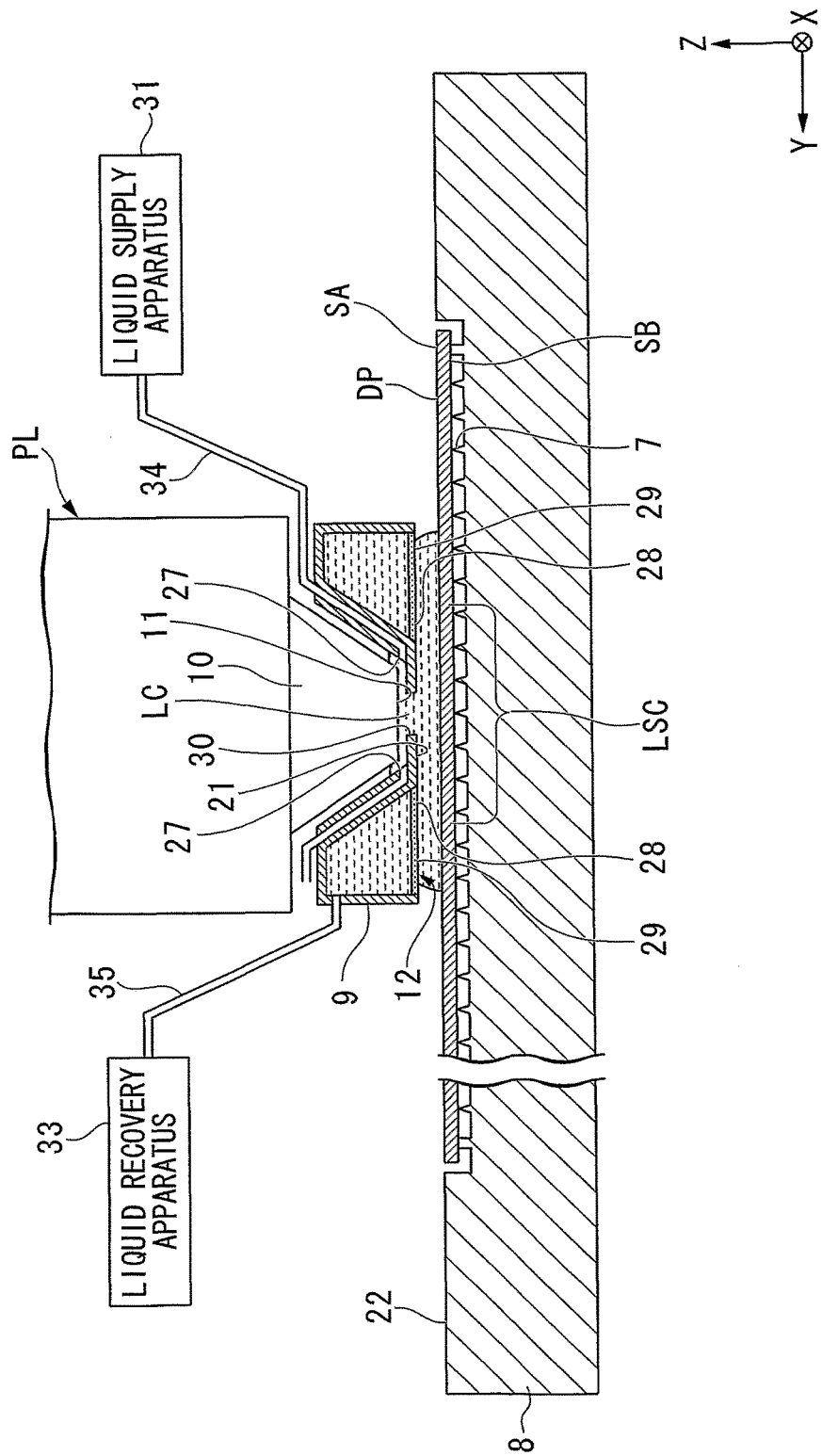
FIG. 9 is a schematic view that shows an example of operation of an exposure apparatus.

FIG. 9 is a schematic view that shows an example of the second cleaning mode. The control apparatus 1 executes the operation of recovery of the cleaning liquid LC from the recovery port 28 in parallel with the operation of supply of the cleaning liquid LC from the supply port 27 to form a liquid immersion space LSC using the cleaning liquid LC between the terminal optical element 10 and liquid immersion member 9 and the dummy substrate DP held by the substrate holding part 7. Through this, at least a part of the lower surface 12 of the liquid immersion member 9 is cleaned. In addition, foreign matter that has been peeled from the lower surface 12 is recovered from the recovery port 28 along with the cleaning liquid LC.

In addition, the control apparatus 1 is able to adjust at least one of the supply operation that uses the supply port 27 and the recovery operation that uses the recovery port 28 so that the size (the size within the XY plane parallel to the lower surface 12) of the liquid immersion space LSC formed by the cleaning liquid LC during cleaning processing of the liquid immersion member 9 becomes larger than the size of the liquid immersion space LS formed by the liquid LQ during exposure of the substrate P. For example, the control apparatus 1 is able to increase the size of the liquid immersion space LSC formed by the cleaning liquid LC by making the supply amount per unit time of cleaning liquid LC supplied from the supply port 27 during cleaning processing of the liquid immersion member 9 larger than the supply amount per unit time of the liquid LQ supplied from the supply port 27 during exposure of the substrate P. Or, the control apparatus 1 is able to increase the size of the liquid immersion space LSC formed by the cleaning liquid LC by making the recovery amount per unit time of the cleaning liquid LC recovered from the recovery port 28 during cleaning processing of the liquid immersion member 9 smaller than the recovery amount per unit time of the cleaning liquid LC recovered from the recovery port 28 during exposure of the substrate P. Of course, the control apparatus 1 may also increase the size of the liquid immersion space LSC formed by the cleaning liquid LC by making the supply amount per unit time of the cleaning liquid LC supplied from the supply port 27 larger while making the recovery amount per unit time of the cleaning liquid LC recovered from the recovery port 28 smaller.

In addition, the control apparatus 1, in the second cleaning mode, may also move the substrate stage 8 within the XY plane in a status in which a liquid immersion space has been formed by the cleaning liquid LC between the terminal optical element 10 and liquid immersion member 9 and the dummy substrate DP held by the substrate holding part 7.

In this way, usage of the dummy substrate DP includes cleaning of at least part of the liquid immersion member 9 in a status in which the dummy substrate DP has been placed in opposition with the liquid immersion member 9. In addition, not only the lower surface 12 of the liquid immersion member 9 but the emitting surface 11 of the terminal optical element 10 is cleaned by the cleaning processing discussed above.

In addition, in the present embodiment, processing that performs photo-cleaning of at least a part of the projection optical system PL using the exposure light EL is executed as maintenance processing. An example of processing that photo-cleans at least a part of the projection optical system PL as maintenance processing will be described below. The photo-cleaning processing of the projection optical system PL is executed in a status in which the emitting surface 11 of the terminal optical element 10 and the dummy substrate DP held by the substrate holding part 7 have been placed in opposition.

In addition, in the present embodiment, photo-cleaning processing of the projection optical system PL is executed in a status in which a liquid immersion space LS has been formed by holding the liquid LQ between the terminal optical element 10 and liquid immersion member 9 and the dummy substrate DP held by the substrate holding part 7.

The control apparatus 1 emits the exposure light EL from the illumination system IL. The exposure light EL that has been emitted from the illumination system IL is emitted from the emitting surface 11 after it is incident to the projection optical system PL and has passed through a plurality of optical elements of the projection optical system PL. In the present embodiment, the exposure light EL is ultraviolet light that has a photo-cleaning effect. Therefore, the optical elements of the projection optical system PL are photo-cleaned by the exposure light EL being irradiated.

In the aforementioned way, in exposure of the substrate P, there is a possibility that a substance (for example, an organic substance such as a photosensitive material) generated (eluted) from the substrate P will mix into the liquid LQ of the liquid immersion space LS. When foreign matter mixes into the liquid LQ of the liquid immersion space LS, there is a possibility that foreign matter will adhere to the emitting surface 11 of the terminal optical element 10 that comes into contact with that liquid LQ. In the present embodiment, the exposure light EL is irradiated to the emitting surface 11 in a status in which the dummy substrate DP, which has restricted generation of foreign matter, and the emitting surface 11 have been placed in opposition, so the emitting surface 11 is photo-cleaned well. In addition, the exposure light EL is irradiated to that emitting surface 11 in a status in which the liquid LQ and the emitting surface 11 have come to contact, so it is possible to obtain a high photo-cleaning effect. In addition, in the present embodiment, the operation of supplying the liquid LQ from the supply port 27 and the operation of recovering the liquid LQ from the recovery port 28 are executed while the exposure light EL is irradiated to the emitting surface 11. Through this, foreign matter that has peeled from the emitting surface 11 is recovered from the recovery port 28.

In this way, maintenance processing includes processing that photo-cleans at least a part of projection optical system PL with the exposure light EL in a status in which the emitting surface 11 and the dummy substrate DP have been placed in opposition, and usage of the dummy substrate DP includes photo-cleaning of at least a part of the projection optical system PL using the exposure light EL. In photo-cleaning of the projection optical system PL, the exposure light EL that has emitted from the emitting surface 11 is irradiated to the dummy substrate DP by arranging the dummy substrate DP at a position that opposes the emitting surface 11. Through this, in photo-cleaning of the projection optical system PL, for example, it is possible to prevent the exposure light EL from being irradiated to the upper surface 22 of the substrate stage 8, the upper surface 50 of the measuring stage 23, etc., and it is possible to restrict deterioration of upper surfaces 22, 50, etc. due to irradiation of the exposure light EL.

Note that, in the present embodiment, it is possible to execute not only the adjustment processing and maintenance processing discussed above but various processing that uses the dummy substrate DP. For example, in a status in which the sequences of adjustment processing, exposure processing, maintenance processing, etc. are not being executed (a so-called idling status), there is a possibility that the environment (temperature, etc.) of the internal space 14 will unfortunately fluctuate due to a status (at least one of the position, movement conditions and drive conditions) of the substrate stage 8 of the internal space 14. Specifically, there is a possibility that, depending on the status of the substrate stage 8, the environment of the internal space 14 in the idling status will unfortunately change from the expected environment. As a result, even if an attempt were made to start exposure of the substrate P from the idling status, there would be a possibility that drawbacks would occur, such as time being unfortunately required until the internal space 14 is adjusted to the expected conditions by means of the chamber apparatus 15 and a reduction in the operation rate of the exposure apparatus EX is invited.

In the present embodiment, usage of the dummy substrate DP includes holding by a substrate holding part 7 arranged at a prescribed position in the internal space 14. Specifically, the control apparatus 1, in the idling status, arranges the substrate holding part 7 that holds the dummy substrate DP at a prescribed position within the internal space 14. The control apparatus 1, in the idling status as well, arranges the substrate holding part 7, which holds the dummy substrate DP, at a prescribed position within the internal space 14 so that the internal space 14 does not change greatly with respect to the expected environment. Or, the control apparatus 1, in the idling status, moves the substrate holding part 7 (substrate stage 8), which holds the dummy substrate DP, along the movement trajectory R1. Through this, even in the idling status, it is possible to restrict the environment (temperature, etc.) of the internal space 14 from unfortunately fluctuating greatly. Through this, for example, it is possible to execute positional measurement of the substrate stage 8 and the measuring stage 23 with good accuracy. For example, in the case in which the substrate stage 8 has a scale measured by an encoder system, thermal deformation of that scale can be restricted.

In addition, in the idling status, by the substrate stage 8 moving along the movement trajectory R1 in a status in which a liquid immersion space LS has been formed by the liquid LQ between the terminal optical element 10 and liquid immersion member 9 and the dummy substrate DP held by the substrate holding part 7, for example, it is possible to restrict the terminal optical element 10 and the liquid immersion member 9 from becoming polluted.

In the above way, in the present embodiment, the dummy substrate DP is held by the substrate holding part 7, and various processing such as adjustment processing and maintenance processing are executed using that dummy substrate DP. The status of usage of that dummy substrate DP is managed by a management apparatus 3.

The management apparatus 3 manages the history of usage of the dummy substrate DP from when usage of the dummy substrate DP is started. The management apparatus 3 manages the dummy substrate DP in relation to a plurality of management items.

In the present embodiment, the management items include at least one of the cumulative time in which the dummy substrate DP is held by the substrate holding part 7, the liquid contact time at which the dummy substrate DP and the liquid LQ are in contact, the number of times a first status in which the dummy substrate DP and the liquid LQ come into contact and a second status in which they do not come into contact are repeated (repetition count), the cumulative energy of the exposure light EL irradiated to the dummy substrate DP, the number of times the dummy substrate DP is transported between the buffer part 17 and the substrate holding part 7 (transport count), and the time from when the dummy substrate DP is unloaded from the accommodating apparatus 13 until it is loaded to the accommodating apparatus 13 (amount of time within the apparatus).

In addition, the management parameters are determined to in advance with respect to the respective plurality of management items discussed above. In the present embodiment, the management parameters are determined according to the description of usage of the dummy substrate DP.

Table 1 shows the description of usage of the dummy substrate DP and the relationship between the predetermined management parameters in relation to the respective management items.

cumulative time and the time within the apparatus becomes long and the repetition count becomes large, there is a possibility that the contact angle (lyophobicity) of the surface of the dummy substrate DP with respect to the liquid LQ will deteriorate.

In addition, there is a possibility that the degree of pollution of the surface of the dummy substrate DP will change according to at least one of the cumulative time, the liquid contact time, the repetition count, and the amount of time within the apparatus. For example, when the liquid contact time of cleaning processing becomes long or the repetition count becomes large, the possibility that foreign matter that has peeled from the liquid immersion member 9

TABLE 1

| Description of Usage | Cumulative Time | Liquid Contact Time | Repetition Count | Cumulative Energy of the Exposure Light | Transport Count | Amount of Time Within the Apparatus |
|---|---|---|---|---|---|---|
| First cleaning mode | 30 days | 30 days | 1,000,000 times | — | 1,000,000 times | 30 days |
| Second cleaning mode | 30 days | 6 hours | 21 times | — | 1,000,000 times | 30 days |
| Adjustment of synchronous movement error | 30 days | 30 days | 1,000,000 times | — | 1,000,000 times | 30 days |
| Adjustment of projection optical system | 30 days | 30 days | 1,000,000 times | 10 J | 1,000,000 times | 30 days |
| Adjustment of the amount of irradiation of exposure light | 30 days | 30 days | 1,000,000 times | 8 J | 1,000,000 times | 30 days |
| Photo-cleaning | 30 minutes | 6 hours | 21 times | 15 J | 30 times | 30 days |

The management parameters are values that are predetermined according to the description of usage of the dummy substrate DP and that concern the lifespan relating to the dummy substrate DP. In other words, the management parameters are terms, determined according to the description of usage of the dummy substrate DP, during which it is possible for the surface status of the dummy substrate DP to maintain the expected performance (values). The surface status of the dummy substrate DP includes at least one of the contact angle (lyophobicity) of the dummy substrate DP with respect to the liquid LQ and the degree of pollution (the amount of foreign matter per unit area) of the surface of the dummy substrate DP.

For example, there is a possibility that the contact angle (lyophobicity) on the surface of the dummy substrate DP with respect to the liquid LQ will change according to the liquid contact time. For example, when the liquid contact time becomes long, there is a high possibility that the contact angle (lyophobicity) of the surface of the dummy substrate DP with respect to the liquid LQ will decrease (deteriorate). In addition, there is a possibility that the contact angle (lyophobicity) of the dummy substrate DP with respect to the liquid LQ will also change according to the cumulative energy of the exposure light EL irradiated to the dummy substrate DP. For example, when the cumulative energy of the exposure light EL irradiated to the dummy substrate DP becomes large, there is a high possibility that the contact angle (lyophobicity) of the surface of the dummy substrate DP with respect to the liquid LQ will decrease (deteriorate). In addition, even in the case in which at least one of the will adhere to the surface of the dummy substrate DP becomes higher, and there is a possibility that the degree of pollution of the surface of the dummy substrate DP will become higher. In addition, when at least one of the cumulative time or the amount of time spent within the apparatus becomes long, the possibility that, for example, foreign matter that floats in the air will adhere to the surface of the dummy substrate DP becomes higher, and there is a possibility that the degree of pollution of the surface of the dummy substrate DP will become higher. In addition, when the transport count becomes large, the possibility that foreign matter (including drops of the liquid LQ) will adhere to the surface SB of the dummy substrate DP during transport becomes higher, and there is a possibility that the degree of pollution of the surface of the dummy substrate DP will become higher.

In Table 1, for example, in the case in which the dummy substrate DP is used in the first cleaning mode, the management parameter relating to the liquid contact time is 30 days. Specifically, in the case in which the dummy substrate DP is used in the first cleaning mode, the liquid contact time up to 30 days is allowed. In the case in which usage in the first cleaning mode is performed, when the liquid contact time exceeds 30 days, for example, there is a high possibility that the contact angle of the surface of the dummy substrate DP with respect to the liquid LQ will unfortunately become lower than the tolerance value (deteriorate). In addition, in the case in which the dummy substrate DP is used in the second cleaning mode, which uses the cleaning liquid LC, the surface of the dummy substrate DP tends to deteriorate in comparison with the case in which usage in the first cleaning mode is performed, so the management parameter relating to the liquid contact time is set to six hours. When the liquid contact time exceeds six hours in the case in which usage in the second cleaning mode is performed, there is a high possibility that the contact angle of the surface of the dummy substrate DP with respect to the liquid LQ will unfortunately decrease (deteriorate) to below the tolerance value.

In this way, in the present embodiment, the management parameters relating to the management items are determined according to the description of usage of the dummy substrate DP.

Note that the management items, management parameters and descriptions of usage, etc. of Table 1 are only examples. The management parameters may be appropriately determined according to, for example, the durability of the surface (film F) of the dummy substrate DP, the status of usage of the dummy substrate DP, etc.

When the lyophobicity of the surface of the dummy substrate DP deteriorates, for example, it becomes no longer possible to hold the liquid LQ (cleaning liquid LC) in the space with respect to the terminal optical element 10 and the liquid immersion member 9 well, and it becomes no longer possible to form a liquid immersion space well. As a result, there is a possibility that nonconformities will occur, such as the liquid of the liquid immersion space unfortunately flowing out during the prescribed processing that uses the dummy substrate DP.

In addition, when the degree of pollution of the surface of the dummy substrate DP deteriorates, there is a possibility that damage will unfortunately increase, such as foreign matter of the dummy substrate DP adhering to members in the vicinity (terminal optical element 10, liquid immersion member 9, substrate stage 8, transport system 4, etc.) during the prescribed processing that uses that dummy substrate DP.

In this way, in the case in which the prescribed processing is performed using the dummy substrate DP, when a dummy substrate DP in which the lyophobicity with respect to the liquid LQ or the degree of pollution has deteriorated continues to be used, there is a possibility that it will be no longer possible to execute that prescribed processing well. As a result, there is a possibility that exposure performance will deteriorate, such as in exposure defects being produced, and that defective devices will be produced.

Therefore, in the present embodiment, the control apparatus 1 determines the appropriateness of usage of the dummy substrate DP based on the output of the management apparatus 3 and the management parameters stored in the storage apparatus 2. As discussed above, the management apparatus 3 includes a timer and a counter, etc. and is able to measure (manage) values relating to the respective management items discussed above. The control apparatus 1 compares the values measured by the management apparatus 3 relating to the respective management items discussed above with the predetermined management parameters and determines the appropriateness of usage of dummy substrate DP based on the results of that comparison.

For example, the control apparatus 1, in the case in which the output of the management apparatus 3 is less than the management parameter determined according to the description of usage of the dummy substrate DP, determines that that dummy substrate DP can be used and continues usage of that dummy substrate DP. On the other hand, the control apparatus 1, in the case in which it has been determined that the output of the management apparatus 3 exceeds the management parameter, determines that that dummy substrate DP is not usable.

The control apparatus 1 uses the transport system 4 to transport the dummy substrates DP that have been determined to be unusable to the accommodating apparatus 13 from at least one of the substrate holding part 7 and the buffer part 17. The control apparatus 1 unloads the usable dummy substrates DP accommodated in the accommodating apparatus 13 from the accommodating apparatus 13 and accommodates them in the buffer part 17. Note that the usable dummy substrates DP include unused dummy substrates DP. The control apparatus 1 starts usage of the dummy substrates DP accommodated in that buffer part 17.

In the present embodiment, two dummy substrates DP are accommodated in the buffer part 17, and the control apparatus 1 determines the respective appropriateness of usage of those two dummy substrates DP. In addition, the control apparatus 1 is able to determine the appropriateness of usage of the respective plurality (for example 50) of dummy substrates DP that the accommodating apparatus 13 is able to accommodate.

In the present embodiment, identification marks are arranged as identifiers of the respective plurality of dummy substrates DP. The identification marks are peculiar marks respectively applied to a plurality of dummy substrates DP. In the present embodiment, an alignment system 19 is able to measure those identification marks. When the identification marks are measured by the alignment system 19, the control apparatus 1 controls the substrate stage 8, which holds the dummy substrate DP, to arrange the identification mark of the dummy substrate DP in the measurement region of the alignment system 19. The alignment system 19 measures the identification mark of the dummy substrate DP held by the substrate holding part 7. The measurement results of the alignment system 19 are output to the control apparatus 1. The control apparatus 1 is able to determine the appropriateness of usage of the respective plurality of dummy substrates DP based on the output of the management apparatus 3 and the measurement results of the alignment system 19.

Note that, the measuring apparatus for measuring the identifiers is not limited to the alignment system 19. For example, the measuring apparatus that is able to measure the identifiers (identification marks) arranged on the dummy substrates DP may also be arranged in the accommodating apparatus 13 or in the transport path between the accommodating apparatus 13 and the buffer part 17.

Note that the identifiers for identifying the respective plurality of dummy substrates DP are not limited to the identification marks and may also be, for example, IC chips arranged in the respective plurality of dummy substrates DP.

In addition, the respective dummy substrates DP may also be identified by tracking and managing the locations of the respective dummy substrates DP within the exposure apparatus EX by means of the control apparatus 1 without providing identifiers on the respective dummy substrates DP.

Through this, the control apparatus 1 is able to obtain the usable dummy substrates DP from among the plurality of dummy substrates DP. For example, the control apparatus 1, based on the output of the management apparatus 3, the management parameters and the measurements results of the identifiers, even in the case in which the usable dummy substrates DP and the unusable dummy substrates DP are mixed in the accommodating apparatus 13, is able to select, from this plurality of dummy substrates DP, the dummy substrates DP to be held in the substrate holding part 7 and used.

In addition, the control apparatus 1 displays the determination results as to the appropriateness of usage of the plurality of dummy substrates DP on a control panel that is not shown, etc. and reports these to the operator. The display contents include one of a display to the effect that said dummy substrate DP is not usable, a display to the effect that said dummy substrate DP is usable and an expiration date, and a display of the current values of the respective management items of said dummy substrate DP (for example, the cumulative time held by the substrate holding part 7 up to the current point in time, the cumulative liquid contact time, the cumulative amount of energy, etc.). Then, the control apparatus 1 prohibits subsequent usage of the dummy substrates DP determined to be unusable.

In addition, the control apparatus 1 is able to select the dummy substrates DP to be held by the substrate holding part 7 and used based on the output of the management apparatus 3 and the predetermined management parameters so that the surface statuses of the plurality of dummy substrates DP become the same. Specifically, that plurality of dummy substrates DP may be sequentially used so that the deterioration statuses of the plurality (for example, 50 units) of the dummy substrates DP become uniform.

Furthermore, the control apparatus 1 is also able to individually manage the respective dummy substrates DP to match the purposes of usage so that the plurality of dummy substrates DP are processing specialized dummy substrates that accompany exposure operations and cleaning specialized dummy substrates. In this case, the respective purposes of usage may be displayed on a control panel that is not shown to correspond to the respective dummy substrates DP.

As described above, in the present embodiment, determination of the appropriateness of usage of the dummy substrates DP was performed based on the output of the management apparatus 3 that manages the statuses of usage of the dummy substrates DP and predetermined management parameters, so, for example, it is possible to restrict a status in which, for example, deteriorated dummy substrates DP continue to be used from occurring. Therefore, it is possible to restrict the occurrence of exposure defects attributable to the usage of deteriorated dummy substrates DP and the occurrence of defective devices.

In addition, in the present embodiment, in the case in which a plurality of dummy substrates DP are prepared, from among the plurality of dummy substrates DP, the dummy substrates DP caused to be held by the substrate holding part 7 and used were selected based on the output of the management apparatus 3 and the management parameters, so, for example, it is possible to restrict the occurrence of non-conformities in which the unusable dummy substrates DP are unfortunately transported to the substrate holding part 7 and those unusable dummy substrates DP are unfortunately used. Therefore, it is possible to restrict the occurrence of exposure defects and the occurrence of defective devices.

In addition, in the present embodiment, it is possible to derive the surface statuses of the dummy substrates DP (at least one of the lyophobicity with respect to the liquid LQ and the degree of pollution) by managing the plurality of management items, so it is possible to use dummy substrates DP which have the expected surface statuses.

Note that, in the present embodiment, it was possible for the buffer part 17 to accommodate two dummy substrates DP. In that case, there may be division into a description of usage of one dummy substrate DP of the two dummy substrates DP accommodated in the buffer part 17 and a description of usage of the other dummy substrate DP. For example, in the case in which the respective two dummy substrates DP are to be used in cleaning processing, one of the dummy substrates DP is used in the first cleaning mode, and the other dummy substrate DP is used in the second cleaning mode.

Note that, in the present embodiment, the dummy substrates DP that are transported to the substrate holding part 7 were made the dummy substrates DP accommodated in the buffer part 17. The dummy substrates DP accommodated in the accommodating apparatus 13 may also be transported to the substrate holding part 7 without going via the buffer part 17. In addition, the dummy substrates DP held by the substrate holding part 7 may also be transported to the accommodating apparatus 13 without going via the buffer part 17.

Note that, in the embodiments discussed above, the accommodating apparatus 13 is able to accommodate at least one of the substrate P for device manufacture and the dummy substrate DP. In that case, an identifier for identifying the type of the accommodated substrate (either a substrate P or dummy substrate DP) may be provided in the accommodating apparatus 13. Specifically, a first identifier can be provided in the accommodating apparatus 13 that accommodates a substrate P, and a second identifier that is different from the first identifier can be provided in the accommodating apparatus 13 that accommodates a dummy substrate DP. Through this, the control apparatus 1 is able to ascertain the type of substrate P accommodated by the accommodating apparatus 13 by measuring the first and second identifiers. In addition, the control apparatus 1, in a case in which the second identifier has been measured, specifically, in a case in which it has been determined that the accommodating apparatus 13 that accommodates a dummy substrate DP is connected to the exposure apparatus EX, is able to start the management operation of the management apparatus 13.

Note that, in the embodiments discussed above, the projection optical system PL fills the optical path space of the emitting side (image plane side) of the terminal optical element with a liquid, but a projection optical system that also fills the optical path space of the incidence side (object plane side) of the terminal optical element with a liquid as disclosed in the specification of U.S. Patent Application Publication No. 2005/0248856 may also be employed.

Note that, the liquid LQ of the respective embodiments discussed above is water, but it may also be a liquid other than water. For the liquid LQ, one that has transmittivity with respect to the exposure light EL, as high a refractive index as possible, and stability with respect to the projection optical system or the film of the photosensitive material (photoresist) that forms the surface of the substrate is preferable. For example, for the liquid LQ, it is also possible to use hydrofluroether (HF), perfluoropolyether (PFPE), Fomblin oil, cedar oil, etc. In addition, for the liquid LQ, one whose refractive index is approximately 1.6~1.8 may also be used. In addition, the optical element (terminal optical element, etc.) of the projection optical system PL that comes into contact with the liquid LQ may also be formed of a material that has a higher refractive index than quartz and fluorite (for example, 1.6 or more). In addition, for the liquid LQ, it is also possible to use various fluids, for example, supercritical fluids.

In addition, for example, in the case in which the exposure light EL is $F_2$ laser light, this $F_2$ laser light does not pass through water, so it is possible to use, as the liquid LQ, one that allows $F_2$ laser light to pass through, for example, a fluorine group fluid such as perfluoropolyether (PFPE), fluorine group oil, etc. In this case, hydrophillization processing is performed by forming a thin film at a portion that comes into contact with the liquid LQ using a substance with a molecular structure that has low polarity including, for example, fluorine.

Note that applicable as the substrate P of the respective embodiments discussed above are not only semiconductor wafers for semiconductor device manufacture but glass substrates for display devices, ceramic wafers for thin-film magnetic heads or mask or reticle base plates (synthetic quartz, silicon wafers), etc. used in exposure apparatuses.

Applicable as the exposure apparatus are, in addition to step-and-scan system scanning type exposure apparatuses (scanning steppers) that synchronously move the mask M and the substrate P to scan expose the pattern of the mask M, step-and-repeat system projection exposure apparatuses (steppers) that full-field expose the pattern of the mask M in a status in which the mask M and the substrate P have been made stationary and sequentially step move the substrate P.

In addition, in step-and-repeat system exposure, after a reduced image of a first pattern has been transferred onto the substrate P using a projection optical system in a status in which the first pattern and the substrate P have been made substantially stationary, a reduced image of the second pattern may be full-field exposed onto the substrate P so that it is partially superposed with the first pattern using a projection optical system in a status in which the second pattern and the substrate P have been made substantially stationary (stitch system full-field exposure apparatus). In addition, for the stitch system exposure apparatus, application to a step-and-stitch system exposure apparatus that partially superposes and transfers at least two patterns on the substrate P and sequentially moves the substrate P is also possible.

In addition, as disclosed in the specification of U.S. Pat. No. 6,611,316, for example, it is also possible to apply the present invention to an exposure apparatus that synthesizes two mask patterns on a substrate via a projection optical system and double exposes, substantially synchronously, one shot region on a substrate by a single scanning exposure. In addition, the present invention is also applicable to a proximity system exposure apparatus, a mirror projection analyzer, etc.

In addition, the present invention is also applicable to twin stage type exposure apparatuses that comprise a plurality of substrate stages such as those disclosed in the specification of U.S. Pat. No. 6,341,007, the specification of U.S. Pat. No. 6,400,441, the specification of U.S. Pat. No. 6,549,269, the specification of U.S. Pat. No. 6,590,634, the specification of U.S. Pat. No. 6,208,407, and the specification of U.S. Pat. No. 6,262,796.

The types of exposure apparatuses EX are not limited to exposure apparatuses for semiconductor device fabrication that expose a semiconductor device pattern on a substrate P but are also widely applicable to exposure apparatuses for the manufacture of such as liquid crystal display elements and for the manufacture of displays, and exposure apparatuses for the manufacture of thin film magnetic heads, image pickup elements (CCDs), micromachines, MEMS, DNA chips or reticles or masks.

In addition, in the respective embodiments discussed above, for the light source apparatus that generates ArF excimer laser light as the exposure light EL, it is possible to use an ArF excimer laser, but is also possible to use a high frequency wave generating apparatus that includes a solid state laser light source such as a DFB semiconductor laser or a fiber laser, a light amplification part that has a fiber amp, a wavelength conversion part, etc. and outputs pulsed light with a wavelength of 193 nm such as that disclosed in the specification of U.S. Pat. No. 7,023,610. In addition, in the embodiments discussed above, the aforementioned illumination regions and projection regions are rectangle shape respectively, but may be other shape such as circular shape.

In the respective embodiments discussed above, a light transmitting type mask that forms a prescribed shielding pattern (or phase pattern/dimming pattern) on a light transmissive substrate is used, but instead of this mask, a variable forming mask (also called electronic mask, active mask, or image generator) that forms a transmittance pattern, a reflection pattern or a light emitting pattern based on electronic data of the pattern to be exposed, such as that disclosed in the specification of U.S. Pat. No. 6,778,257, may also be used. The variable forming mask includes, for example, a DMD (digital micro-mirror device), which is a kind of non-emissive type image display device (spatial light modulator). In addition, the variable forming mask is not limited to a DMD, and the non-emissive type image display device described below may be used in place of a DMD. Here, the non-emissive type image display device is an element that spatially modulates the amplitude (intensity), phase or deflection status of light that progresses in a prescribed direction, and examples of transmitting type spatial modulators are, in addition to a transmission type liquid crystal display element (LCD: liquid crystal display), an electrochromic display (ECD), etc. In addition, other examples of reflecting type spatial light modulators are, in addition to the DMD discussed above, a reflection mirror array, a reflecting type liquid crystal display element, an electrophoretic display (EPD), electronic paper (or electronic ink), and a grating light valve and the like.

In addition, instead of the variable forming mask comprising a non-emissive type image display device, a pattern forming apparatus that includes a self-emissive type image display element may also be used. In this case, an illumination system is not required. Here, examples of the self-emissive type image display element are a CRT (cathode ray tube), an inorganic EL display, an organic EL display (OLED: organic light emitting diode), an LED display, an LD display, a field emission display (FED), and a plasma display (PDP: plasma display panel). In addition, used for the self-emissive type image display element with which the pattern formation apparatus is equipped are a solid state light source chip that has a plurality of light emission points, a solid state light source chip array on which chips are arranged in a plurally arrayed shape, or a type in which a plurality of light emission points are built into one substrate, and the solid state light source chip may also be electrically controlled to form a pattern. Note that the solid state light source element may be inorganic or organic.

In the respective embodiments discussed above, an exposure apparatus that comprises a projection optical system PL was described as an example, but it is also possible to apply the present invention to exposure apparatuses and exposure methods that do not use a projection optical system PL. Even in the case in which, in this way, a projection optical system PL is not used, the exposure light is irradiated to the substrate via an optical member such as a lens, etc., and the liquid immersion part is formed in a prescribed space between such an optical member and the substrate.

In addition, it is also possible to apply the present invention to an exposure apparatus (lithography system) that exposes a line and space pattern onto a substrate P by forming interference fringes on the substrate P as disclosed in, for example, the International Patent Publication No. 2001/035168 pamphlet.

As discussed above, the exposure apparatus EX of the embodiment of the present application is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that manufacture of the exposure apparatus be performed in a clean room in which the temperature, the degree of cleanliness, etc. are controlled.

Figure 10:
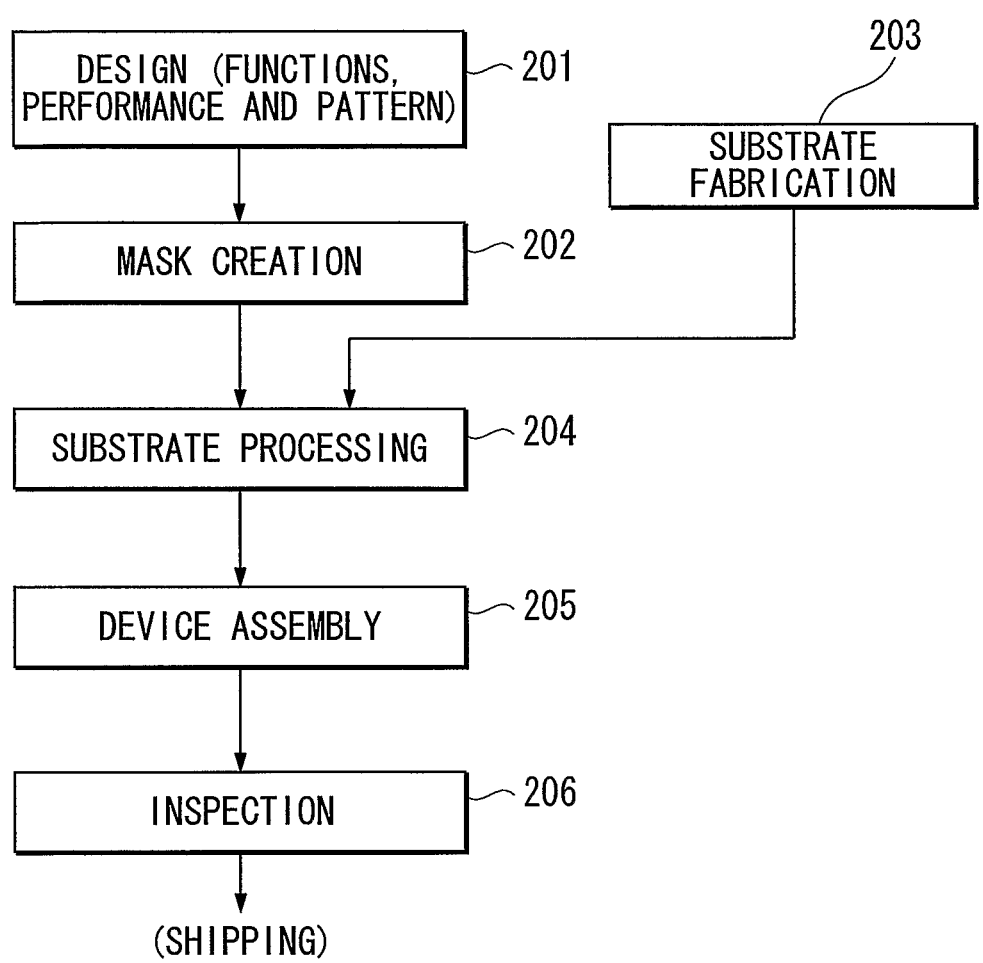
FIG. 10 is a flow chart that shows an example of a device manufacturing method.

As shown in FIG. 10, micro devices such as semiconductor devices are manufactured by going through a step 201 that performs micro device function and performance design, a step 202 that creates the mask (reticle) based on this design step, a step 203 that manufactures the substrate that is the device base material, a substrate processing step 204 that includes substrate processing (exposure processing) that exposes the substrate with exposure light using the pattern of a mask according to the embodiments discussed above and develops the exposed substrate, a device assembly step (including processing processes such as the dicing process, bonding process and packaging process) 205, an inspection step 206, etc. Operations that use the dummy substrate DP of the embodiments discussed above are included in the substrate processing step 204.

Note that the requirements of the respective embodiments discussed above may be appropriately combined. In addition, the disclosures of all public documents and U.S. patents relating to the exposure apparatuses, etc. that have been cited in the respective embodiments and modification examples discussed above shall be invoked and considered a part of the descriptions of this document.

The invention claimed is:

1. An exposure apparatus that exposes a substrate using exposure light via a liquid comprising:
a substrate holding part, which releasably holds the substrate and is capable of moving;
a management apparatus, which manages usage history information, in maintenance process for the exposure apparatus, of a plurality of dummy substrates, the maintenance process being performed during non-exposure of the dummy substrates and having a plurality of types of maintenance processings, wherein the usage history information of a dummy substrate includes a liquid contact time during which the dummy substrate and the liquid come into contact; and
a control apparatus that selects one dummy substrate from the plurality of dummy substrates for a next maintenance processing, based on the usage history information and at least one management value, the at least one management value being determined based on a type of the next maintenance processing.

2. The exposure apparatus according to claim 1, wherein the usage history information of each dummy substrate includes usage in a status in which holding by the substrate holding part is performed.

3. The exposure apparatus according to claim 1, wherein the control apparatus selects the selected dummy substrate so that surface statuses of the plurality of dummy substrates become the same.

4. The exposure apparatus according to claim 1, wherein the management value is stored by at least one of the management apparatus and the control apparatus and is determined corresponding to a description of usage of the dummy substrate.

5. The exposure apparatus according to claim 1, wherein the management apparatus manages the usage history information of each dummy substrate after usage of the dummy substrate has started.

6. The exposure apparatus according to claim 1; wherein the usage history information of a dummy substrate includes a time period in which the dummy substrate has been held by the substrate holding part.

7. The exposure apparatus according to claim 1, wherein a first status, in which a dummy substrate and the liquid come into contact, and a second status in which there is no contact are repeated, and
the usage history information of a dummy substrate includes the number of times the first status and the second status of the dummy substrate are repeated.

8. The exposure apparatus according to claim 1, wherein the usage history information of a dummy substrate includes a cumulative energy of the exposure light irradiated to the dummy substrate.

9. The exposure apparatus according to claim 1, wherein the usage history information of a dummy substrate includes a number of times the dummy substrate is transported between a first accommodating apparatus, which accommodates the dummy substrate, and the substrate holding part.

10. The exposure apparatus according to claim 1, wherein the usage history information of a dummy substrate includes a time from when the dummy substrate is unloaded from a second accommodating apparatus, which accommodates the dummy substrate, until the dummy substrate is again loaded to the second accommodating apparatus.

11. The exposure apparatus according to claim 1, wherein the management apparatus stores the management value with respect to each dummy substrate.

12. The exposure apparatus according to claim 11, wherein the management value of a dummy substrate corresponds to a description of usage of the dummy substrate.

13. The exposure apparatus according to claim 1, further comprising:
a liquid immersion member, which holds the liquid between the liquid immersion member and the substrate so that an optical path of the exposure light irradiated to the substrate is filled with the liquid, and
wherein the usage history information of a dummy substrate includes holding of liquid between the dummy substrate and the liquid immersion member.

14. The exposure apparatus according to claim 13,
wherein the usage history information of a dummy substrate includes movement in a status in which placing in opposition with the liquid immersion member has been performed.

15. The exposure apparatus according to claim 13,
wherein the usage history information of a dummy substrate includes cleaning of at least a part of the liquid immersion member in a status in which placing in opposition with the liquid immersion member has been performed.

16. The exposure apparatus according to claim 1, further comprising:
an optical system that has an emitting surface, which emits the exposure light to an exposure position,
wherein the usage history information of a dummy substrate includes usage in a status in which placing in opposition with the emitting surface has been performed.

17. The exposure apparatus according to claim 16,
wherein the usage history information of a dummy substrate includes irradiation of the exposure light that has emitted from the emitting surface.

18. The exposure apparatus according to claim 16,
wherein the usage history information of a dummy substrate includes adjustment of an amount of irradiation of the exposure light.

19. The exposure apparatus according to claim 16,
wherein the usage history information of a dummy substrate includes adjustment of the optical system.

20. The exposure apparatus according to claim 1, further comprising a prescribed member, which forms a prescribed space that includes an exposure position and is temperature regulated,
wherein the usage history information of a dummy substrate includes holding the dummy substrate on the substrate holding part arranged at a prescribed position within the prescribed space.

21. The exposure apparatus according to claim 1, further comprising:
a mask holding part, which holds a mask, wherein the mask holding part and the substrate holding part are synchronously moved in prescribed directions with respect to an optical path of the exposure light,
wherein the usage history information a dummy substrate includes adjustment of synchronous movement error between the mask holding part and the substrate holding part in a status in which the dummy substrate is held by the substrate holding part.

22. A device manufacturing method, comprising:
exposing a substrate using the exposure apparatus according to claim 1; and
developing the exposed substrate.

23. An exposure method that exposes a substrate using exposure light via a liquid, the method comprising:
managing, in maintenance process for an exposure apparatus, usage history information of each dummy substrate of a plurality of dummy substrates, the maintenance process being performed during non-exposure of the dummy substrates and having a plurality of types of maintenance processings, wherein the usage history information of a dummy substrate includes a liquid contact time during which the dummy substrate and the liquid come into contact;
selecting one dummy substrate from the plurality of dummy substrates for a next maintenance processing, based on the usage history information and at least one management value, the at least one management value being determined based on a type of the next maintenance processing; and
holding the selected dummy substrate by a substrate holding part of the exposure apparatus and executing a prescribed processing using the selected dummy substrate.

24. The exposure method according claim 23, further comprising:
holding the liquid between a liquid immersion member and the selected dummy substrate so that an optical path of the exposure light irradiated to the selected dummy substrate is filled with the liquid,
wherein the prescribed processing includes cleaning at least a part of the liquid immersion member in a status in which the liquid immersion member and the selected dummy substrate have been placed in opposition.

25. The exposure method according to claim 23, further comprising:
exposing the selected dummy substrate by the exposure light emitted from an emitting surface of an optical system,
wherein the prescribed processing includes adjusting an amount of irradiation of the exposure light in a status in which the emitting surface and the dummy substrate have been placed in opposition.

26. The exposure method according to claim 23, further comprising:
exposing the selected dummy exposed by the exposure light that is emitted from an emitting surface of an optical system,
wherein the prescribed processing includes adjusting the optical system in a status in which the emitting surface and the dummy substrate have been placed in opposition.

27. The exposure method according to claim 23, further comprising:
moving the substrate holding part, which holds the selected dummy substrate, within a prescribed space that includes an exposure position and is temperature regulated,
wherein the prescribed processing includes arranging the substrate holding part at a prescribed position within the prescribed space.

28. The exposure method according to claim 23, further comprising:
synchronously moving a mask holding part, which holds a mask, and the substrate holding part, which holds the selected dummy substrate, in prescribed directions with respect to an optical path of the exposure light,
wherein the prescribed processing includes adjusting the synchronous movement of the mask holding part and the substrate holding part in a status in which the selected dummy substrate is held by the substrate holding part.

29. A device manufacturing method, comprising:
exposing a substrate using an exposure method according to claim 23, and
developing the exposed substrate.

30. A maintenance method of an exposure apparatus that exposes a substrate using exposure light via a liquid, the method comprising:
managing, in maintenance process for an exposure apparatus, usage history information of each dummy substrate of a plurality of dummy substrates, the maintenance process being performed during non-exposure of the dummy substrates and having a plurality of types of maintenance processings, wherein the usage history information of a dummy substrate includes a liquid contact time during which the dummy substrate and the liquid come into contact;

selecting one dummy substrate from the plurality of dummy substrates for a next maintenance processing to be, based on the usage history information and at least one management value, the at least one management value being determined based on a type of the next maintenance processing;

holding the selected dummy substrate at a substrate holding part of the exposure apparatus, which releasably holds the selected dummy substrate; and holding the liquid between the selected dummy substrate and a prescribed member to perform the next maintenance of the prescribed member processing.

31. The maintenance method according to claim 30, wherein the selecting is performed so that surface statuses of the plurality of dummy substrates become the same.

32. A device manufacturing method, comprising:

exposing a substrate using an exposure apparatus maintained by a maintenance method according to claim 30, and developing the exposed substrate.

33. An adjustment method of an exposure apparatus that exposes a substrate using exposure light via a liquid, the method comprising:

managing, in maintenance process for an exposure apparatus, usage history information of each dummy substrate of a plurality of dummy substrates, the maintenance process being performed during non-exposure of the dummy substrates and having a plurality of types of maintenance processings, wherein the usage history information of a dummy substrate includes a liquid contact time during which the dummy substrate and the liquid come into contact;

selecting one dummy substrate from the plurality of dummy substrates for a next maintenance processing, based on the usage history information and at least one management value, the at least one management value being determined based on a type of the next maintenance processing;

holding the selected dummy substrate by a substrate holding part of the exposure apparatus, which releasably holds the selected dummy substrate; and adjusting the exposure apparatus in a status in which the selected dummy substrate has been held by the substrate holding part.

34. The adjustment method according to claim 33, wherein the selecting is performed so that surface statuses of the plurality of dummy substrates become the same.

35. A device manufacturing method, comprising:

exposing a substrate using an exposure apparatus adjusted by the adjustment method according to claim 33, and developing the exposed substrate.

* * * * *